United States Patent
Fukuzumi et al.

(10) Patent No.: US 10,756,105 B2
(45) Date of Patent: Aug. 25, 2020

(54) MEMORY ARRAYS AND METHODS USED IN FORMING A MEMORY ARRAY

(71) Applicant: Micron Technology, Inc., Boise, ID (US)

(72) Inventors: Yoshiaki Fukuzumi, Kanagawa (JP); M. Jared Barclay, Middleton, ID (US); Emilio Camerlenghi, Bergamo (IT); Paolo Tessariol, Arcore (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/200,158

(22) Filed: Nov. 26, 2018

(65) Prior Publication Data
US 2020/0168622 A1    May 28, 2020

(51) Int. Cl.
| | |
|---|---|
| *H01L 27/115* | (2017.01) |
| *H01L 27/11582* | (2017.01) |
| *H01L 27/11565* | (2017.01) |
| *H01L 21/768* | (2006.01) |
| *H01L 21/28* | (2006.01) |

(52) U.S. Cl.
CPC .. *H01L 27/11582* (2013.01); *H01L 21/76802* (2013.01); *H01L 21/76831* (2013.01); *H01L 27/11565* (2013.01); *H01L 29/40117* (2019.08)

(58) Field of Classification Search
None
See application file for complete search history.

(56) References Cited

U.S. PATENT DOCUMENTS

| | | | |
|---|---|---|---|
| 10,236,301 B1* | 3/2019 | Howder | H01L 27/11565 |
| 10,580,783 B2* | 3/2020 | Cui | H01L 27/11529 |
| 2014/0077126 A1 | 3/2014 | Benson et al. | |

(Continued)

FOREIGN PATENT DOCUMENTS

| | | |
|---|---|---|
| KR | 10-2017-0106051 | 9/2017 |
| WO | PCT/US2019/055521 | 1/2020 |
| WO | PCT/US2019/065521 | 1/2020 |

OTHER PUBLICATIONS

U.S. Appl. No. 15/890,503, filed Feb. 7, 2018, by Howder et al.

*Primary Examiner* — Hrayr A Sayadian
(74) *Attorney, Agent, or Firm* — Wells St. John P.S.

(57) ABSTRACT

A method used in forming a memory array comprises forming a tier comprising conductor material above a substrate. Sacrificial islands comprising etch-stop material are formed directly above the conductor material of the tier comprising the conductor material. A stack comprising vertically-alternating insulative tiers and wordline tiers is formed above the sacrificial islands and the tier comprising the conductor material. Etching is conducted through the insulative tiers and the wordline tiers to the etch-stop material of individual of the sacrificial islands to form channel openings that have individual bases comprising the etch-stop material. The sacrificial islands are removed through individual of the channel openings to extend the individual channel openings to the tier comprising the conductor material. Channel material is formed in the extended-channel openings to the tier comprising the conductor material. The channel material is electrically coupled with the conductor material of the tier comprising the conductor material. Structure independent of method is disclosed.

39 Claims, 27 Drawing Sheets

(56) References Cited

U.S. PATENT DOCUMENTS

| | | |
|---|---|---|
| 2015/0011063 A1 | 1/2015 | Hull et al. |
| 2017/0194348 A1 | 7/2017 | Hopkins |
| 2017/0263620 A1 | 9/2017 | Lee |
| 2018/0047739 A1 | 2/2018 | Dorhout et al. |
| 2018/0261613 A1* | 9/2018 | Ariyoshi ............ H01L 23/5226 |
| 2019/0096808 A1* | 3/2019 | Tsutsumi .......... H01L 27/11582 |
| 2020/0051995 A1* | 2/2020 | Tanaka ............. H01L 27/11556 |
| 2020/0058673 A1* | 2/2020 | Nishikawa ........ H01L 27/11573 |

* cited by examiner

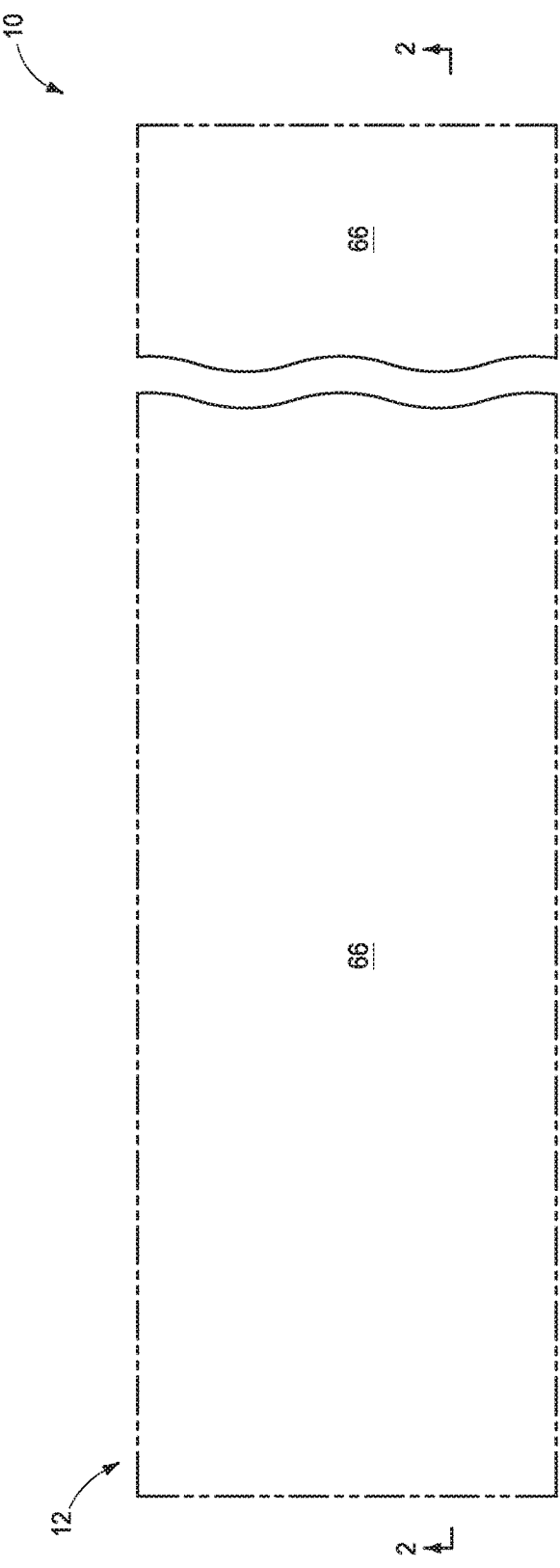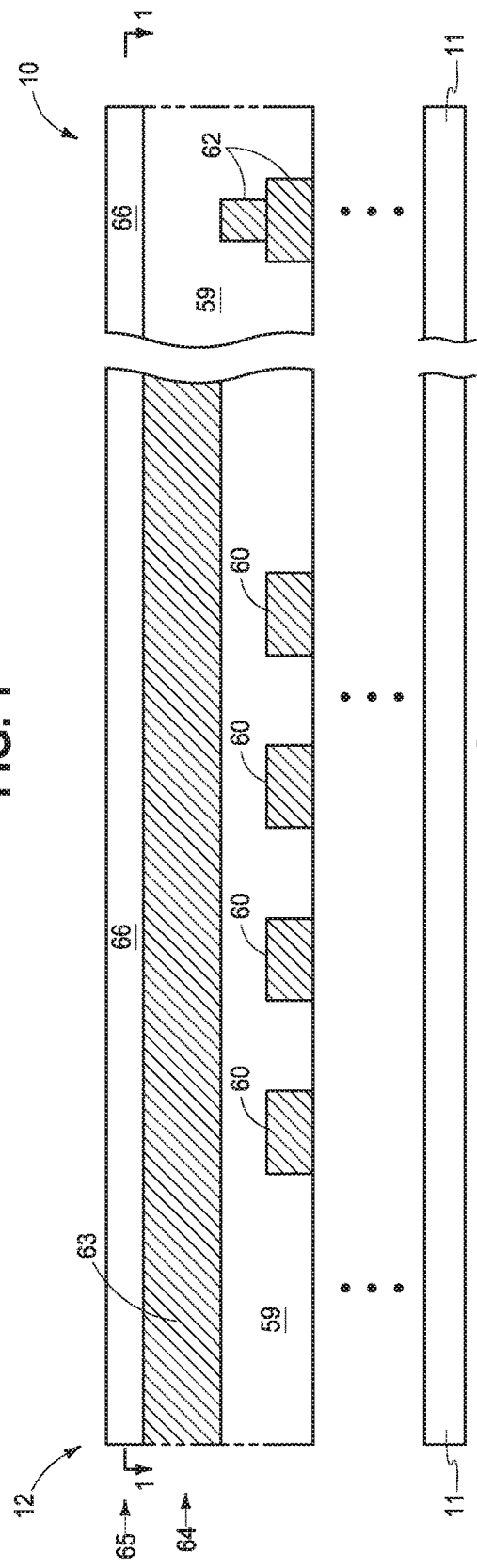

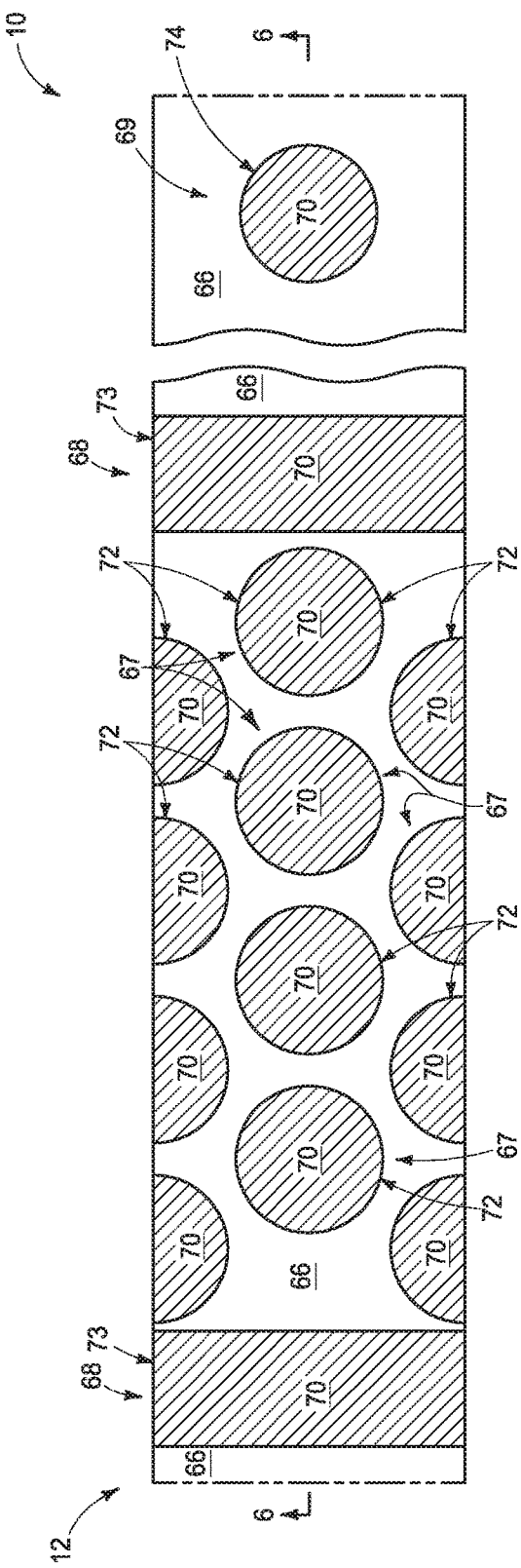
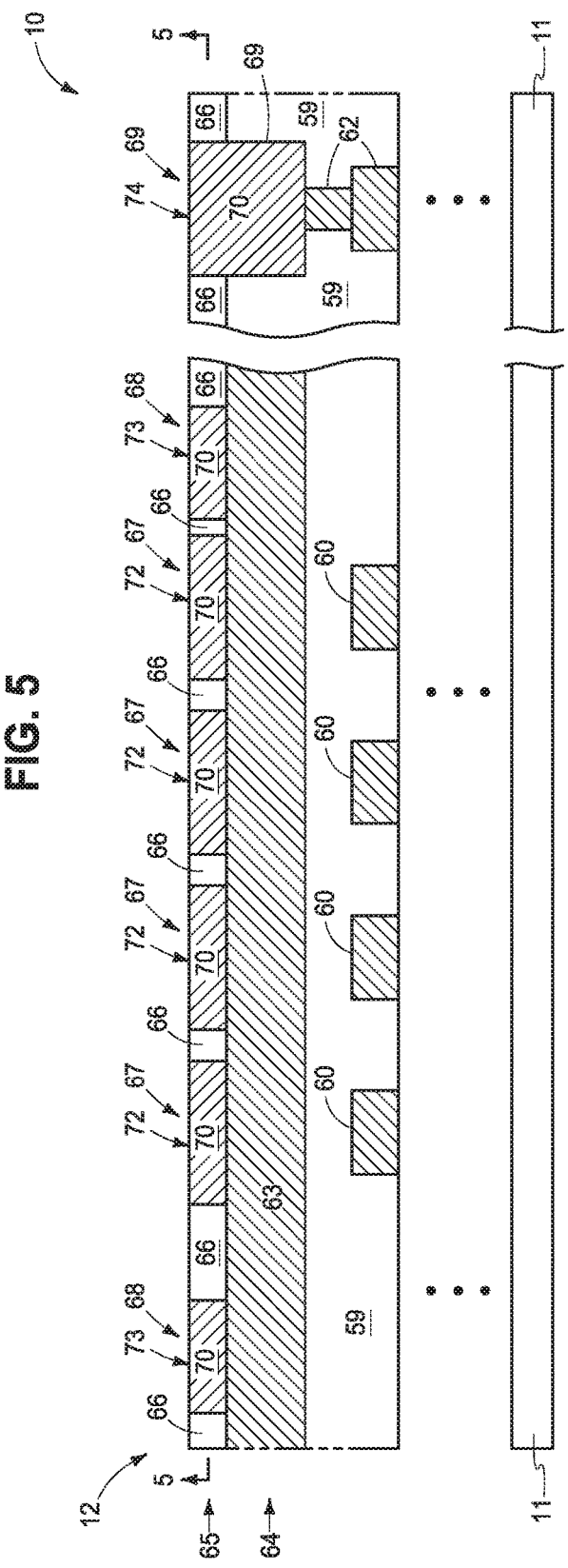

MEMORY ARRAYS AND METHODS USED IN FORMING A MEMORY ARRAY

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

BRIEF DESCRIPTION OF THE DRAWINGS

FIG. 1 is a diagrammatic cross-sectional view of a portion of a substrate in process in accordance with an embodiment of the invention and is taken through line 1-1 in FIG. 2.

FIG. 2 is a view taken through line 2-2 in FIG. 1.

FIG. 5 is a view of the FIG. 3 substrate at a processing step subsequent to that shown by FIG. 3 and is taken through line 5-5 in FIG. 6.

FIG. 6 is a view taken through line 6-6 in FIG. 5.

DETAILED DESCRIPTION OF EXAMPLE EMBODIMENTS

Figure 3:
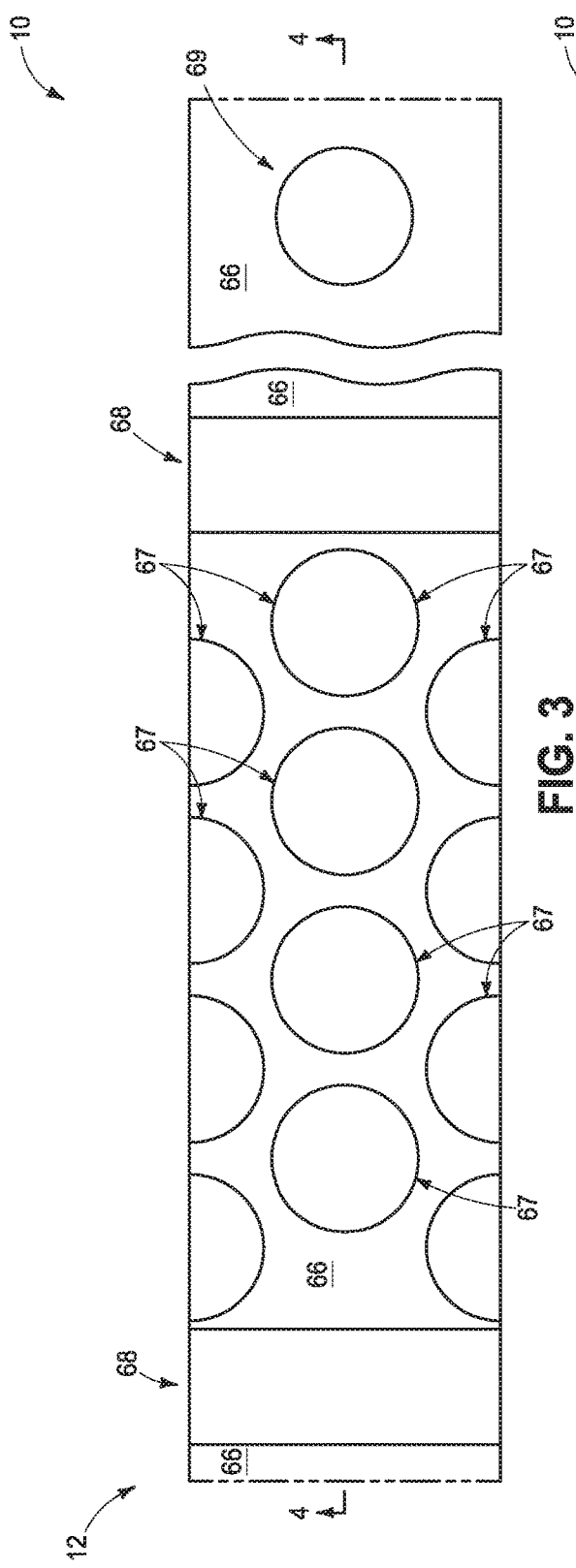
FIG. 3 is a view of the FIG. 1 substrate at a processing step subsequent to that shown by FIG. 1 and is taken through line 3-3 in FIG. 4.

Embodiments of the invention encompass methods used in forming an array of transistors and/or memory cells, for example an array of NAND or other memory cells having peripheral control circuitry under the array (e.g., CMOS under-array). Embodiments of the invention encompass so-called "gate-last" or "replacement-gate" processing, so-called "gate-first" processing, and other processing whether existing or future-developed independent of when transistor gates are formed. Embodiments of the invention also encompass an array of transistors and/or memory cells (e.g., NAND or other memory cells) independent of method of manufacture. First example method embodiments are described with reference to FIGS. 1-29 which may be considered as a "gate-last" or "replacement-gate" process.

FIGS. 1 and 2 show a substrate construction 10 in process in a method of forming an array 12 of elevationally-extending strings of transistors and/or memory cells (not yet shown). Substrate construction 10 comprises a base substrate 11 having any one or more off conductive/conductor/conducting (i.e., electrically herein), semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

FIG. 2 shows circuit components 60 and 62 as part of construction 10 that have been formed above base substrate 11. Such may comprise control and/or other peripheral circuitry as referred to above and are not otherwise material to the inventions disclosed herein. Insulator material 59 (e.g., silicon dioxide or silicon nitride) surrounds and is above components 60 and 62. A tier 64 comprising conductor material 63 has been formed above substrate 11 and components/materials 59, 60, and 62 (e.g., within array or array region 12). Any suitable conductor material may be used, for example one or both of metal material or conductively-doped semiconductor material. In one embodiment, conductor material 63 comprises conductively-doped polysilicon formed atop tungsten silicide. Conductive material 63 may comprise part of control circuitry (e.g., peripheral-under-array circuitry) used to control read and write access to the transistors and/or memory cells that will be formed within array 12. In one embodiment, conductor material 63 within tier 64 may be patterned as a common source (e.g., a source line) of NAND circuitry, for example as shown in U.S. Patent Application Publication No. 2017/0140833 to Caillat et al. published on May 18, 2017, and which is hereby and herein fully incorporated by reference. A tier 65 comprising insulator material 66 (e.g., silicon dioxide and/or silicon nitride) has been formed above tier 64.

Figure 4:
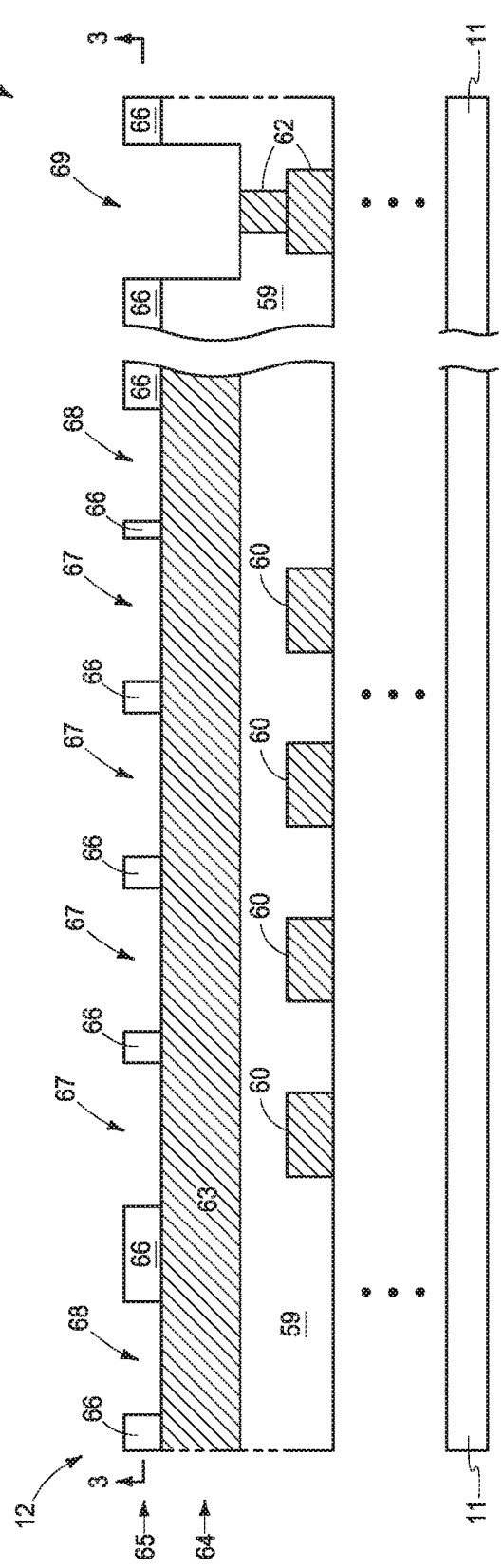
FIG. 4 is a view taken through line 4-4 in FIG. 3.

Referring FIGS. 3 and 4, openings 67 and 68 have been formed through insulator material 66 of tier 65 to conductor material 63 of tier 64. An opening 69 has also been formed through materials 66 and 59 to component 62. Such may be formed by any existing or future-developed technique, for example photolithography. Openings 67, 68, and 69 are individually shown as having the same respective size and shape (e.g., circular for openings 67 and 69 and elongated trenches for openings 68) although alternate sizes and shapes may be used. Example opening 69 is deeper in construction 10 than openings 67 and 68. Where such are formed by etching, forming materials 62 and 59 of polysilicon and silicon dioxide, respectively, may facilitate etching of deeper opening 69 without requiring additional processing steps or consideration.

Referring to FIGS. 5 and 6, sacrificial islands 72 comprising etch-stop material 70 have been formed directly above conductor material 63 of tier 64. Such may occur, for example, by depositing etch-stop material 70 to fill openings 67 and then planarizing or polishing back material 70 at least to an uppermost surface of insulator material 66. In one embodiment, etch-stop material 70 comprises conductive material (e.g., conductive-doped semiconductor material or metal material). In one embodiment, etch-stop material 70 comprises a radially-outer dielectric material (e.g., silicon dioxide or silicon nitride, and not shown) and a radially-inner conductive material (e.g., TiN and W, and not shown). In one embodiment, etch-stop material 70 is insulative. In one embodiment and as shown, lines 73 of etch-stop material 70 have also been formed directly above conductor material 63 of tier 64, with sacrificial islands 72 being spaced from and between lines 73. Lines 73 may be sacrificial lines where, for example, etch-stop material 70 is conductive. Lines 73 may be sacrificial or non-sacrificial lines where, for example, etch-stop material 70 is insulative. In one embodiment where etch-stop material 70 is conductive, non-sacrificial landing pads 74 have been formed to directly electrically couple with conductive through-array-vias (TAVs) to be formed. Conductive etch-stop material 70 in such an embodiment forms a conductive path from respective tops to respective bottoms of sacrificial islands 72 and non-sacrificial landing pads 74.

Figure 7:
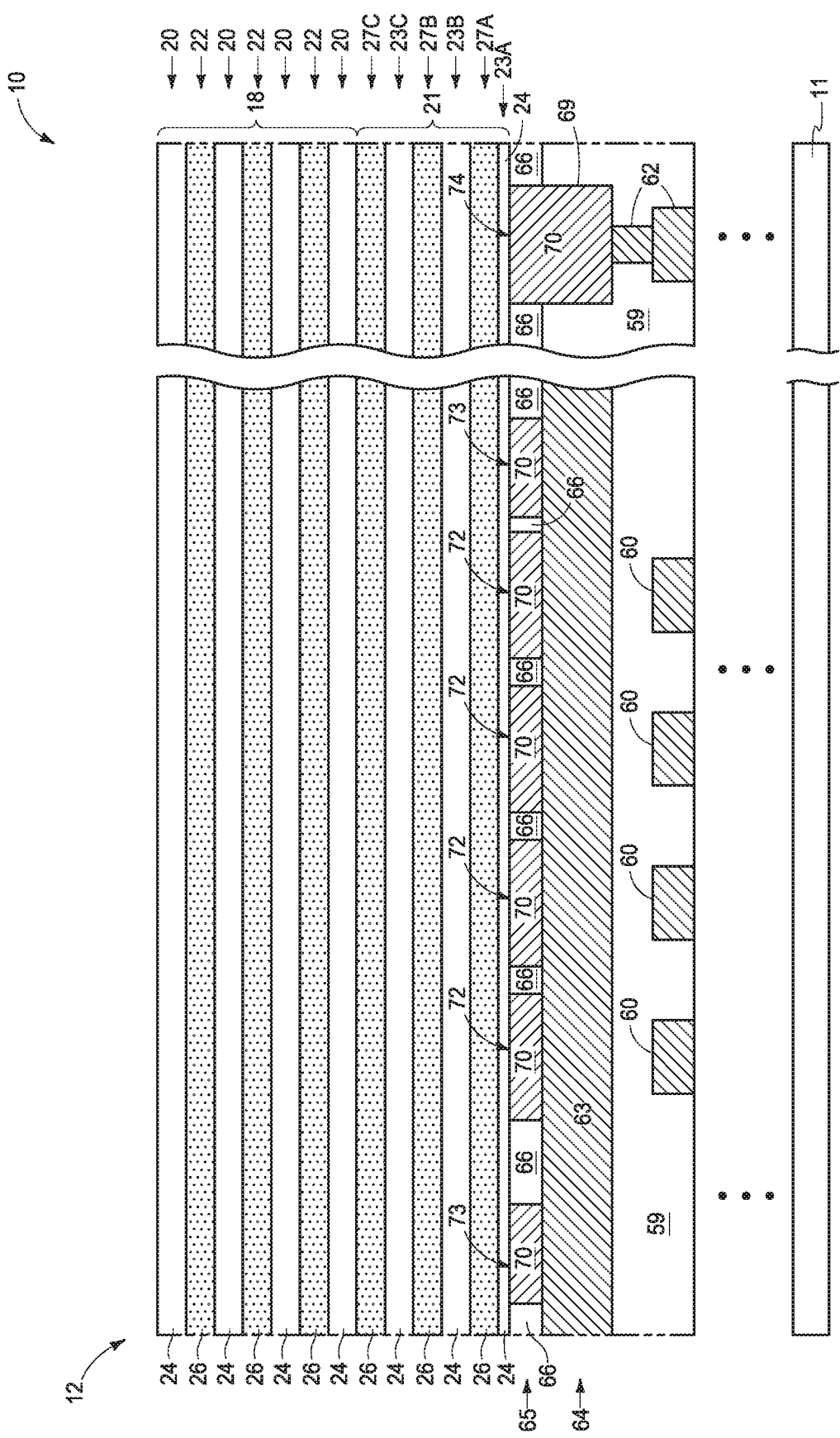
FIG. 7 is a view of the FIG. 5 substrate at a processing step subsequent to that shown by FIG. 5.

Referring to FIG. 7, a stack 18 comprising vertically-alternating insulative tiers 20 and wordline tiers 22 has been formed above sacrificial islands 72, lines 73, and tier 64 comprising conductor material 63. In one embodiment, a stack 21 comprising vertically-alternating insulative tiers 23* (e.g., 23A, 23B, 23C, generically referred to as 23*) and conductor tiers 27* (e.g., 27A, 27B, 27C, generically referred to as 27*) have been provided between stack 18 and tier 65 comprising etch-stop material 70 (e.g., by forming stack 21 before forming stack 18). Tiers 22 and 27* may not comprise conductive material and tiers 20 and 23* may not comprise insulative material or be insulative at this point in processing. Only a small number of tiers 20 and 22 is shown, with more likely stack 18 comprising dozens, a hundred or more, etc. of tiers 20 and 22. Analogously, stack 21 when present may comprise more or less vertically alternating tiers. Example wordline tiers 22 and conductor tiers 27* comprise first material 26 (e.g., silicon nitride) which may be wholly or partially sacrificial. Example insulative tiers 20 and 23* comprise a second material 24 (e.g., silicon dioxide) that is of different composition from that of first material 26 and which may be wholly or partially sacrificial. Other circuitry that may or may not be part of peripheral and/or control circuitry (not shown) may be fabricated, for example multiple vertically-alternating tiers of conductive material and insulative material (not shown) of such circuitry may be fabricated above an uppermost of the wordline tiers 22.

Figure 8:
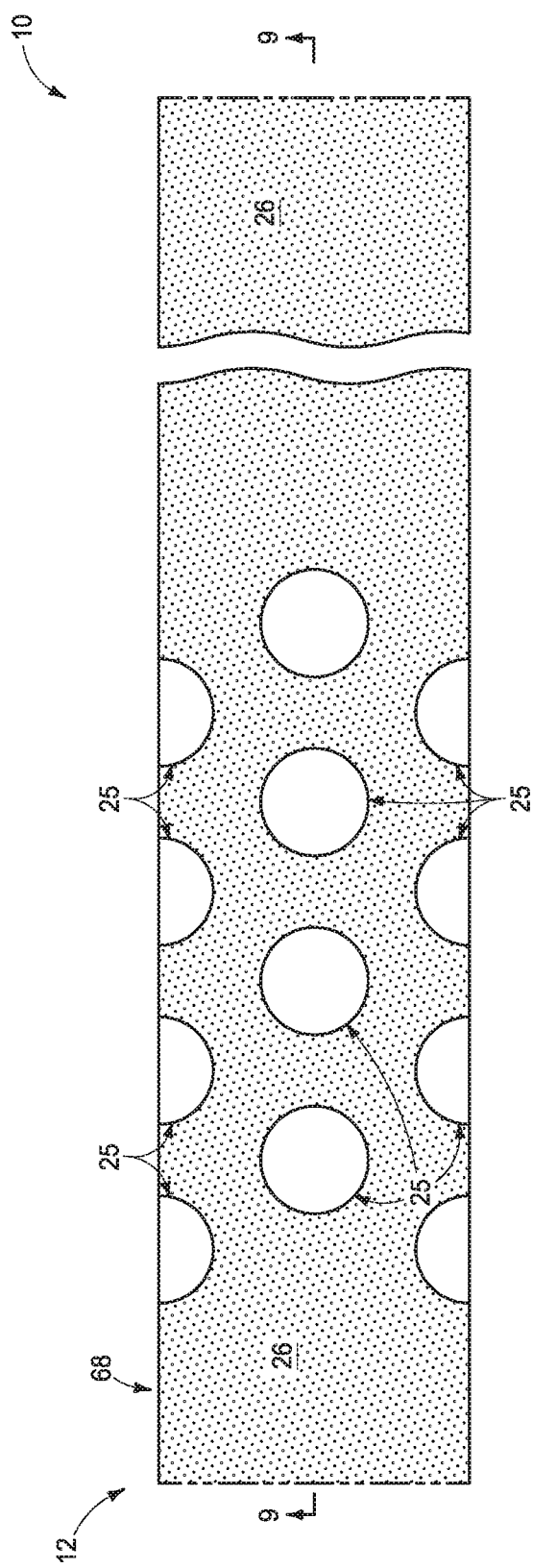
FIG. 8 is a view of the FIG. 7 substrate at a processing step subsequent to that shown by FIG. 7 and is taken through line 8-8 in FIG. 9.
Figure 9:
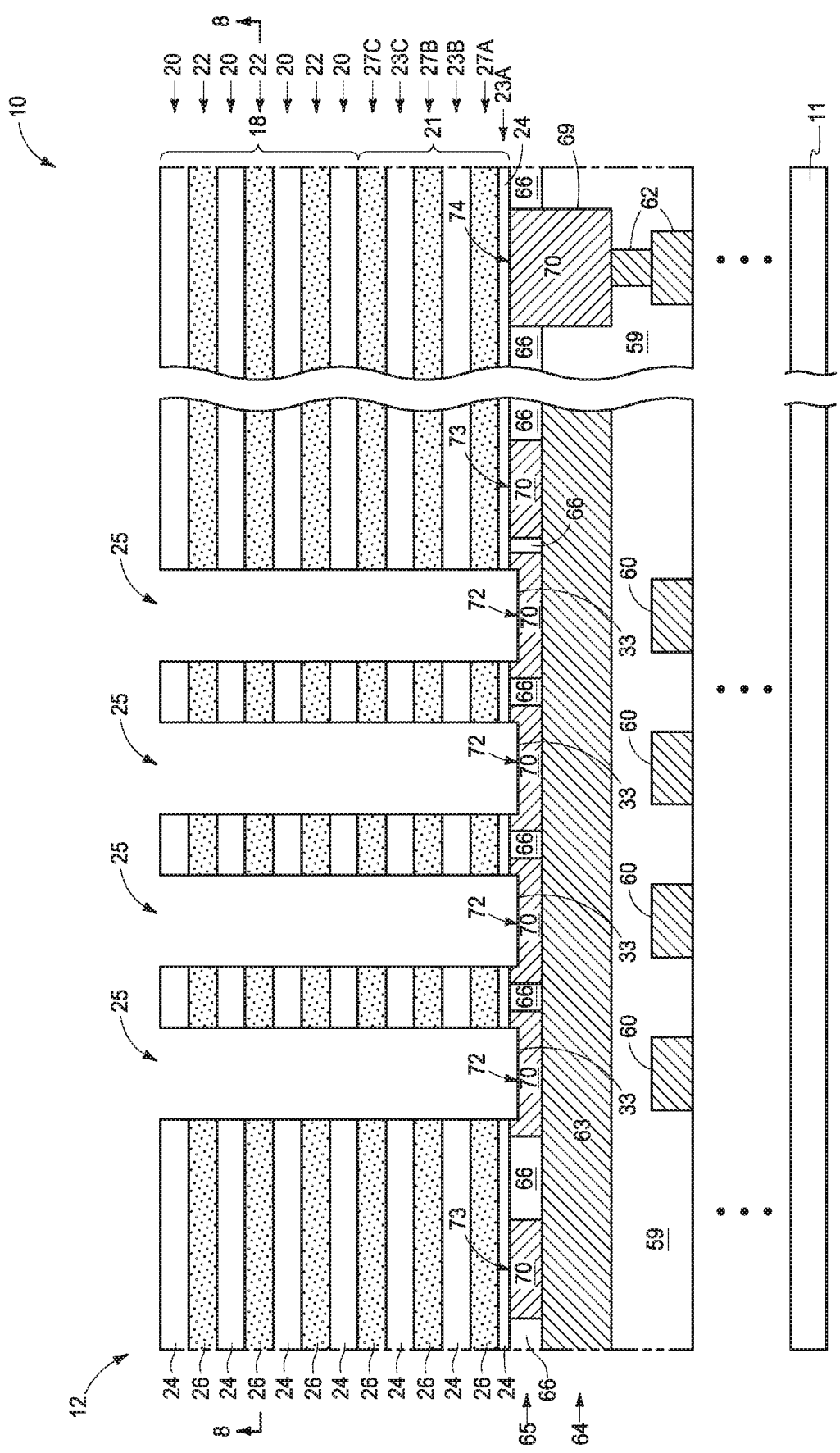
FIG. 9 is a view taken through line 9-9 in FIG. 8.

Referring to FIGS. 8 and 9, etching has been conducted through insulative tiers 20 and wordline tiers 22, and stack 21 when present, to etch-stop material 70 (i.e., which acts as an etch stop) of individual sacrificial islands 72 to form channel openings 25 that have individual bases 33 comprising etch-stop material 70. Channel openings 25 may go into etch-stop material 70 (as shown) or may stop there-atop (not shown). In one embodiment and as shown, individual islands 72 are diametrically larger than individual channel openings 25. Alternately, but less preferred, individual islands 72 may be of the same or smaller horizontal size as individual channel openings 25 (not shown).

Figure 10:
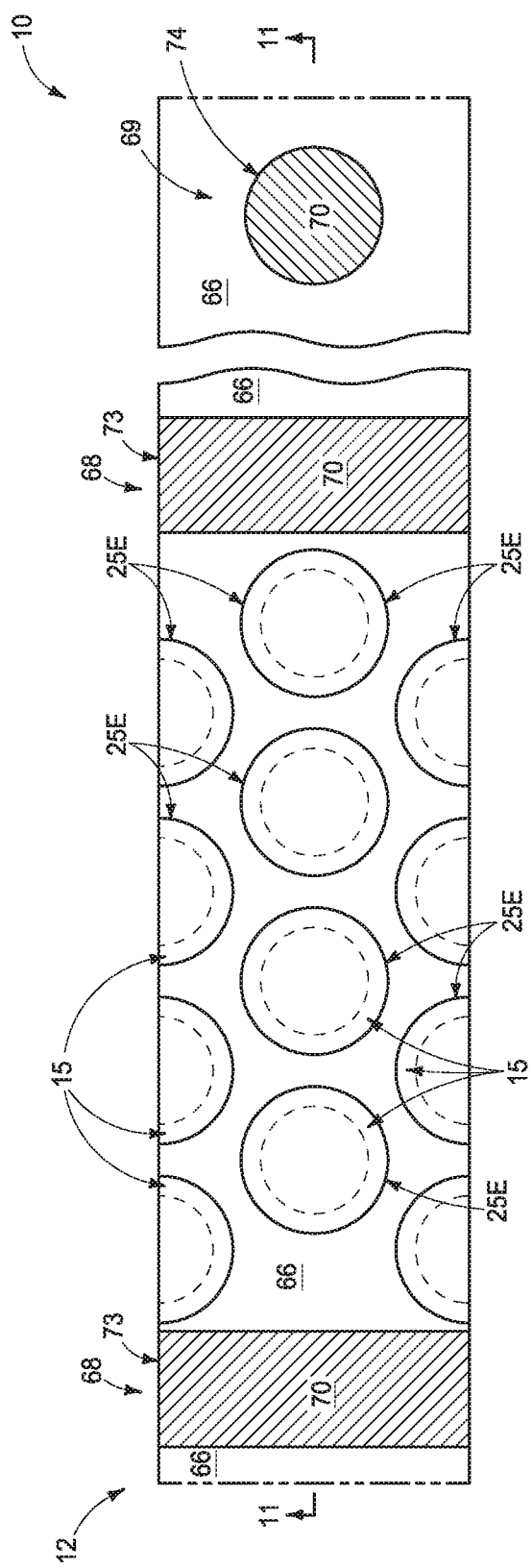
FIG. 10 is a view of the FIG. 8 substrate at a processing step subsequent to that shown by FIG. 8 and is taken through line 10-10 in FIG. 11.
Figure 11:
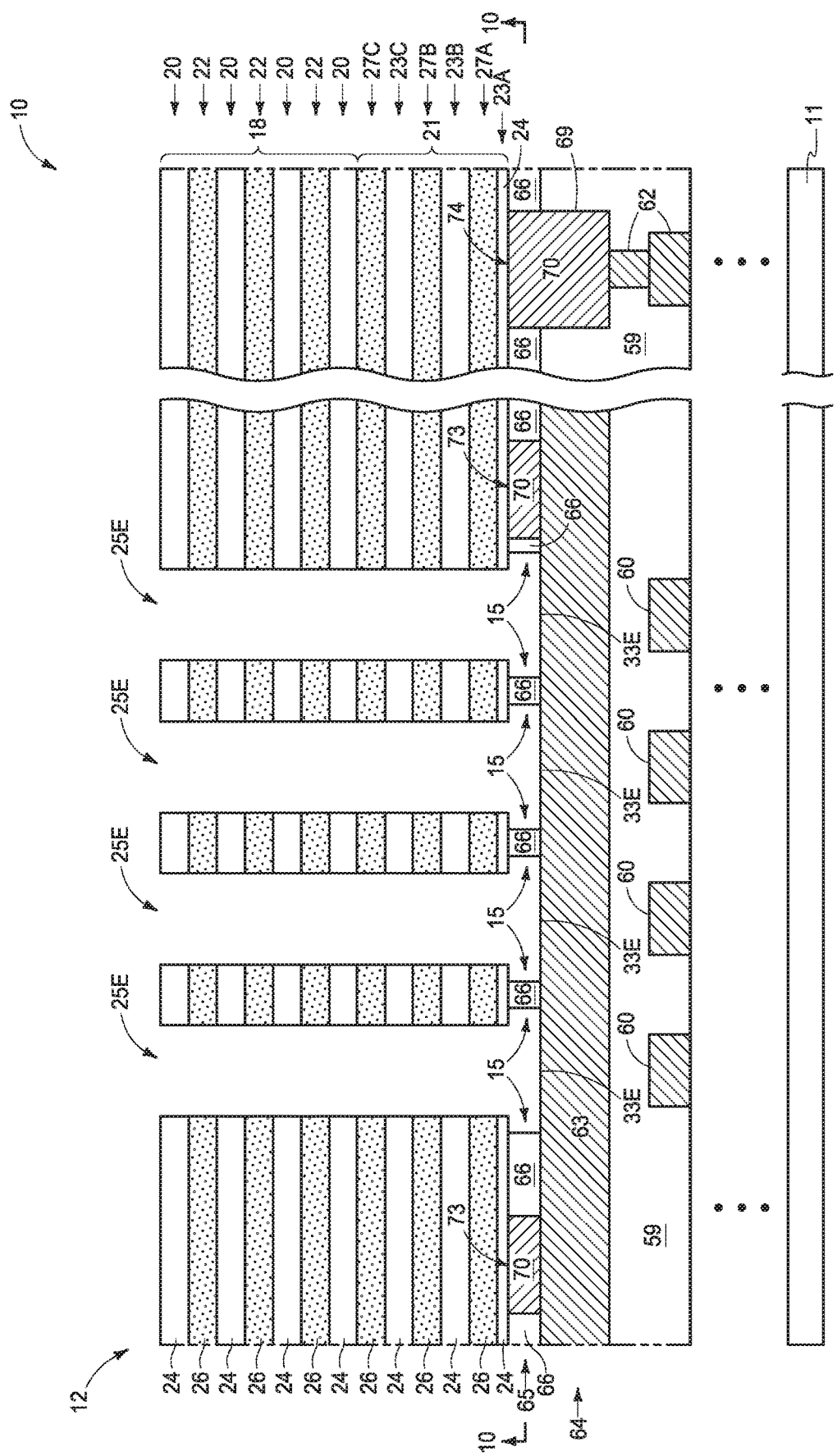
FIG. 11 is a view taken through line 11-11 in FIG. 10.

Referring to FIGS. 10 and 11, sacrificial islands 72 (not shown) have been removed (e.g., by wet or dry isotropic etching, and which may be conducted selectively relative to other exposed materials) through individual channel openings 25 of FIGS. 8 and 9 to extend such channel openings (now designated as 25E having bases 33E) to tier 64. In one such embodiment and as shown, extended-channel openings 25E extend to conductor material 63. The act of removing sacrificial islands 72 (not shown) may result in extended-channel openings 25E going into conductor material 63 (not shown) or may stop there-atop (as shown). In one embodiment and as shown where islands 72 are individually diametrically larger than channel openings 25 prior to removing islands 72, the act of removing forms channel openings 25E to individually have an annular recess 15 in tier 65 comprising insulator material 66 that projects radially outward (e.g., relative to initially formed channel openings 25).

Transistor channel material is formed in the extended-channel openings to the tier comprising the conductor material to be electrically coupled with the conductor material thereof. In some embodiments, individual memory cells of the array are formed to comprise a gate region (e.g., a control-gate region) and a memory structure laterally between the gate region and the channel material. In one such embodiment, the memory structure is formed to comprise a charge-blocking region, charge-storage material, and insulative charge-passage material. The charge-storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a bandgap-engineered structure having nitrogen containing material [e.g., silicon nitride] sandwiched between two insulator oxides [e.g., silicon dioxide]) is laterally between the channel material and the charge-storage material.

Figure 12:
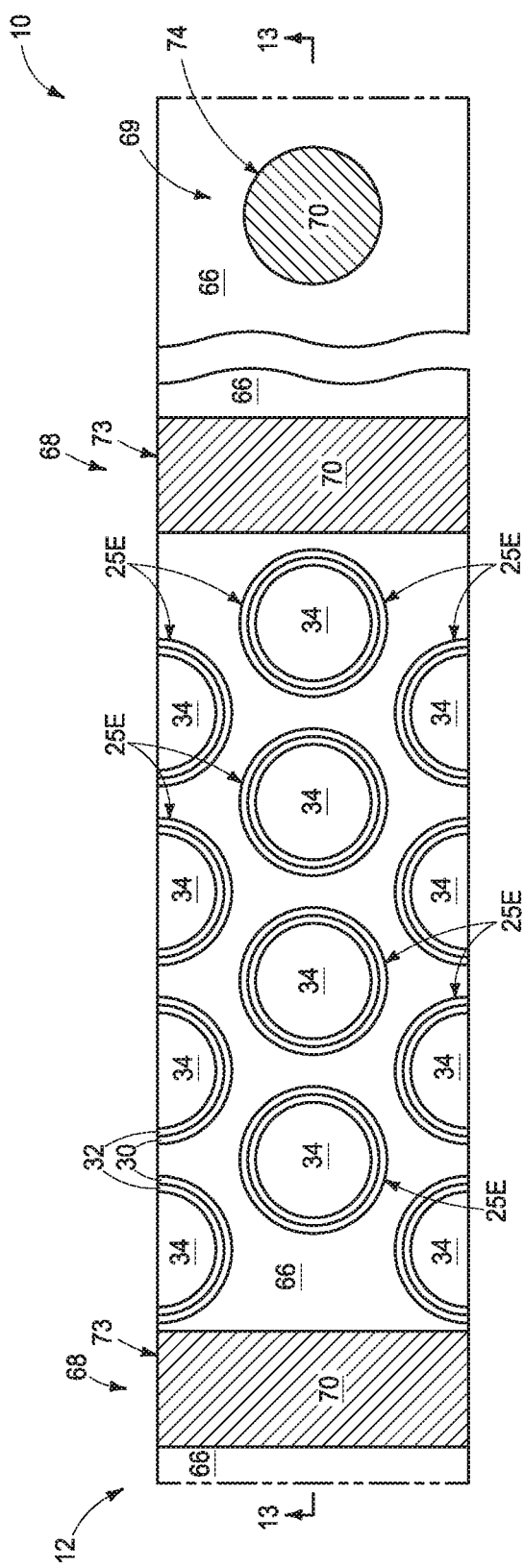
FIG. 12 is a view of the FIG. 10 substrate at a processing step subsequent to that shown by FIG. 10 and is taken through line 12-12 in FIG. 13.
Figure 13:
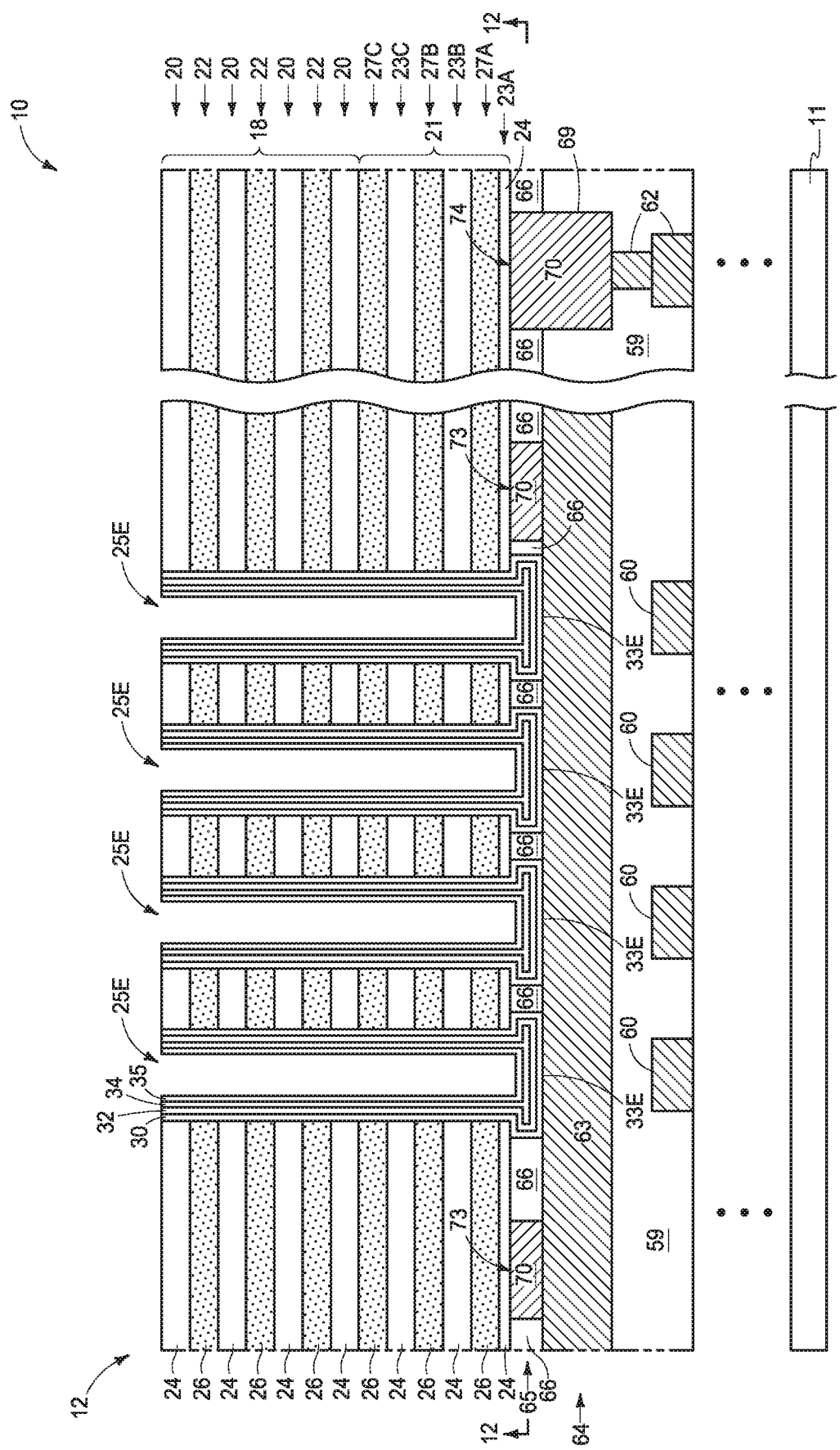
FIG. 13 is a view taken through line 13-13 in FIG. 12.

FIGS. 12 and 13 show one embodiment wherein charge-blocking material 30, charge-storage material 32, and charge-passage material 34 have been formed in individual extended-channel openings 25E elevationally along insulative tiers 20 and wordline tiers 22 and within annular recesses 15. A sacrificial protective material 35 (e.g., polysilicon) has been formed along charge-passage material 34. Transistor materials 30, 32 and 34 (e.g., memory cell materials), and material 35, may be formed by, for example, deposition of respective thin layers thereof over stack 18 and within individual extended-channel openings 25E.

Figure 14:
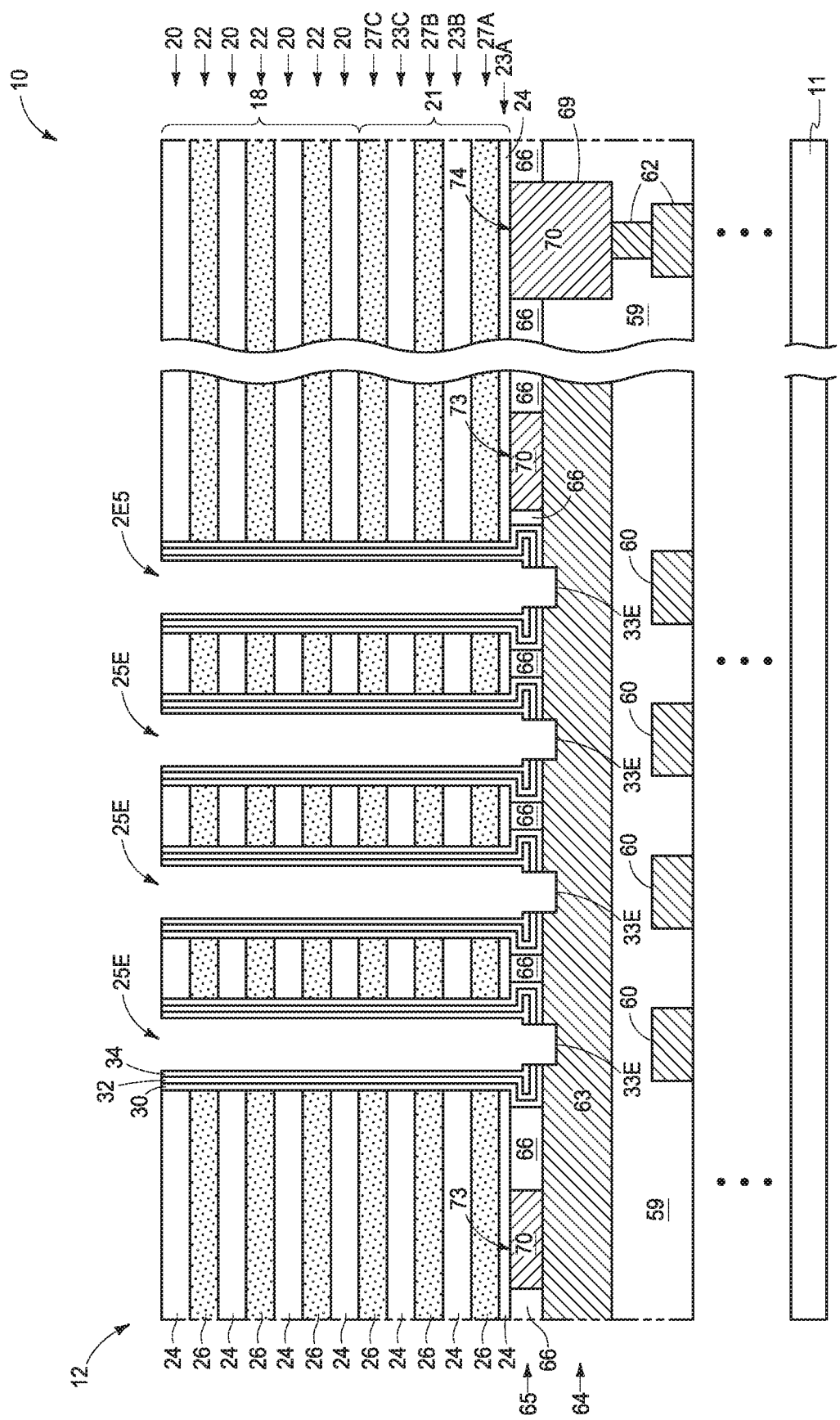
FIG. 14 is a view of the FIG. 13 substrate at a processing step subsequent to that shown by FIG. 13.

Referring to FIG. 14, punch etching has been conducted to remove materials 30, 32, and 34 from bases 33E of extended-channel openings 25E to expose conductor material 63 and sacrificial protective material 35 (not shown) has been removed (e.g., by selective wet etching). Such punch etching may result in extended-channel openings 25E going into conductor material 63 (as shown) or may stop there-atop (not shown).

Figure 15:
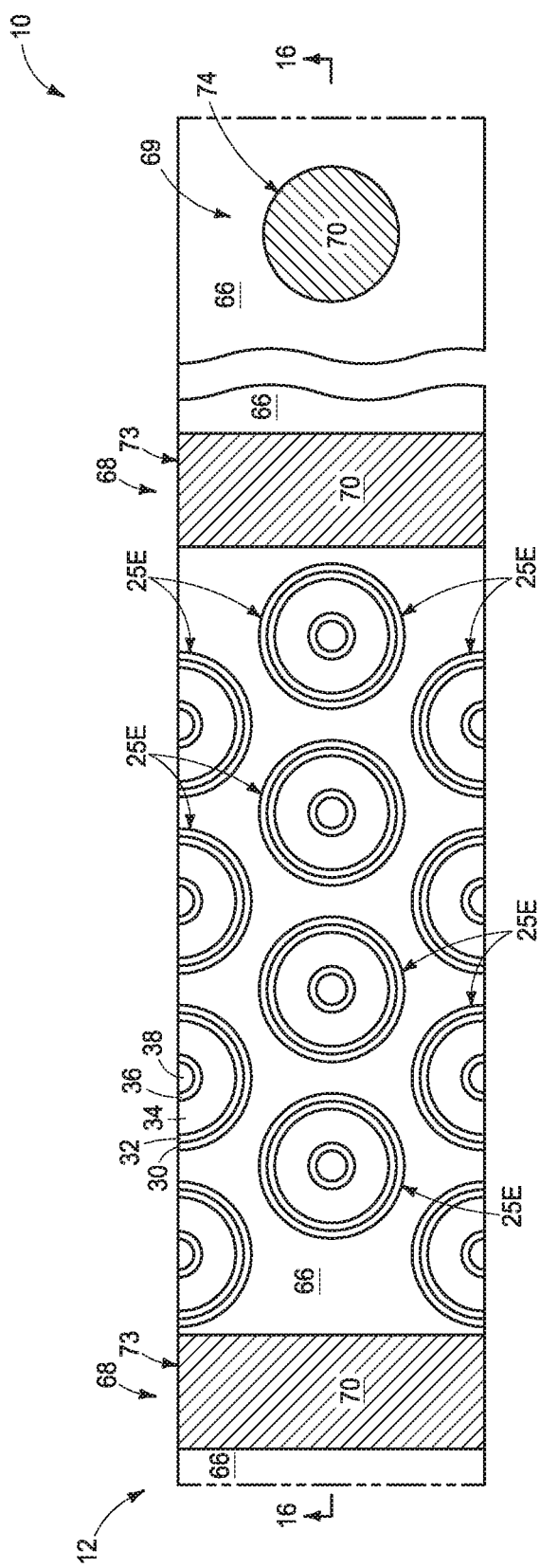
FIG. 15 is a view of the FIG. 13 substrate at a processing step subsequent to that shown by FIG. 13 and is taken through line 15-15 in FIG. 16.
Figure 16:
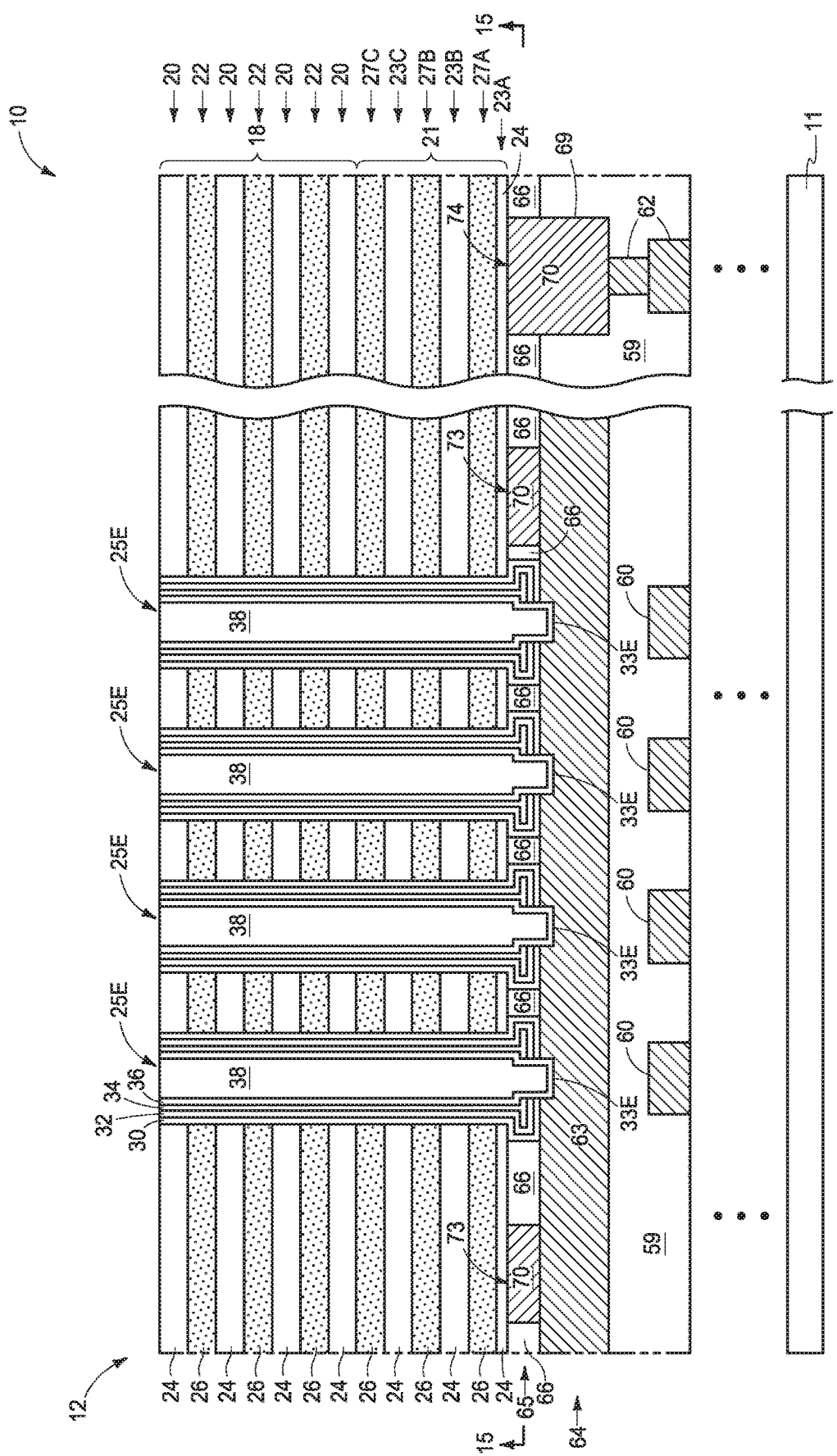
FIG. 16 is a view taken through line 16-16 in FIG. 15.

Referring to FIGS. 15 and 16, channel material 36 has then been formed in extended-channel openings 25E elevationally along insulative tiers 20 and wordline tiers 22. In one embodiment and as shown, none of channel material 36 is formed in annular recesses 15. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 are 25 to 100 Angstroms. Extended-channel openings 25E are shown as comprising a radially-central solid dielectric material 38 (e.g., spin-on-dielectric, silicon dioxide, and/or silicon nitride). Alternately, and by way of example only, the radially-central portion within extended-channel openings 25E may include void space(s) (not shown) and/or be devoid of solid material (not shown).

Figure 17:
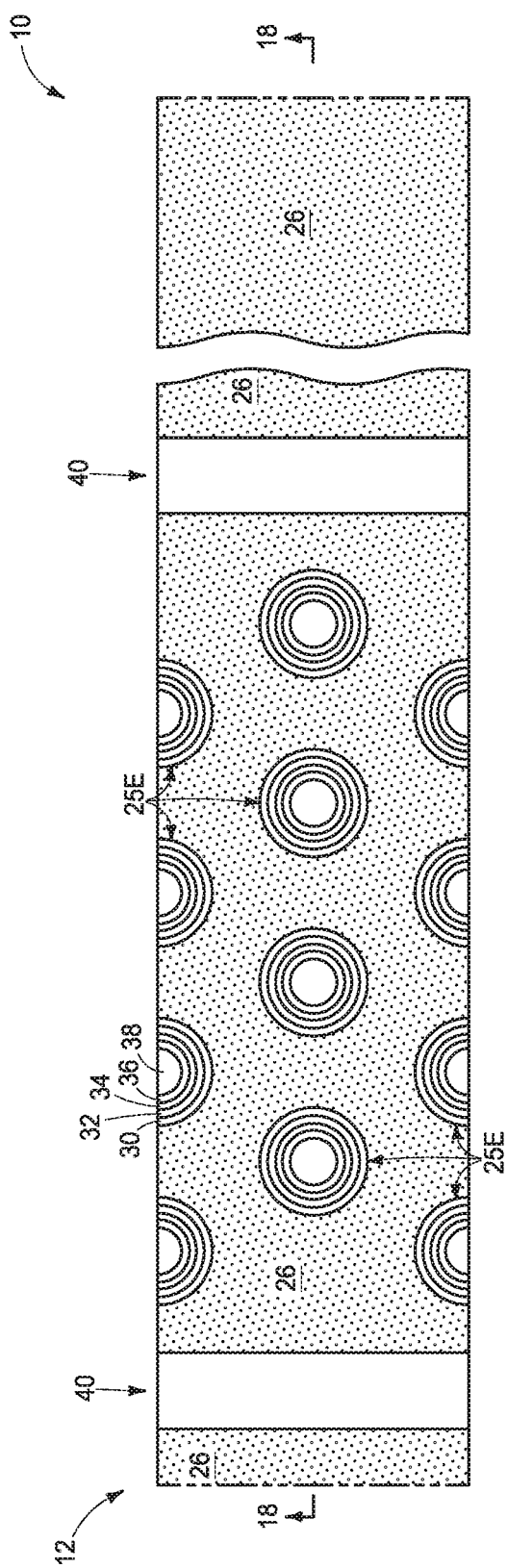
FIG. 17 is a view of the FIG. 15 substrate at a processing step subsequent to that shown by FIG. 15 and is taken through line 17-17 in FIG. 18.
Figure 18:
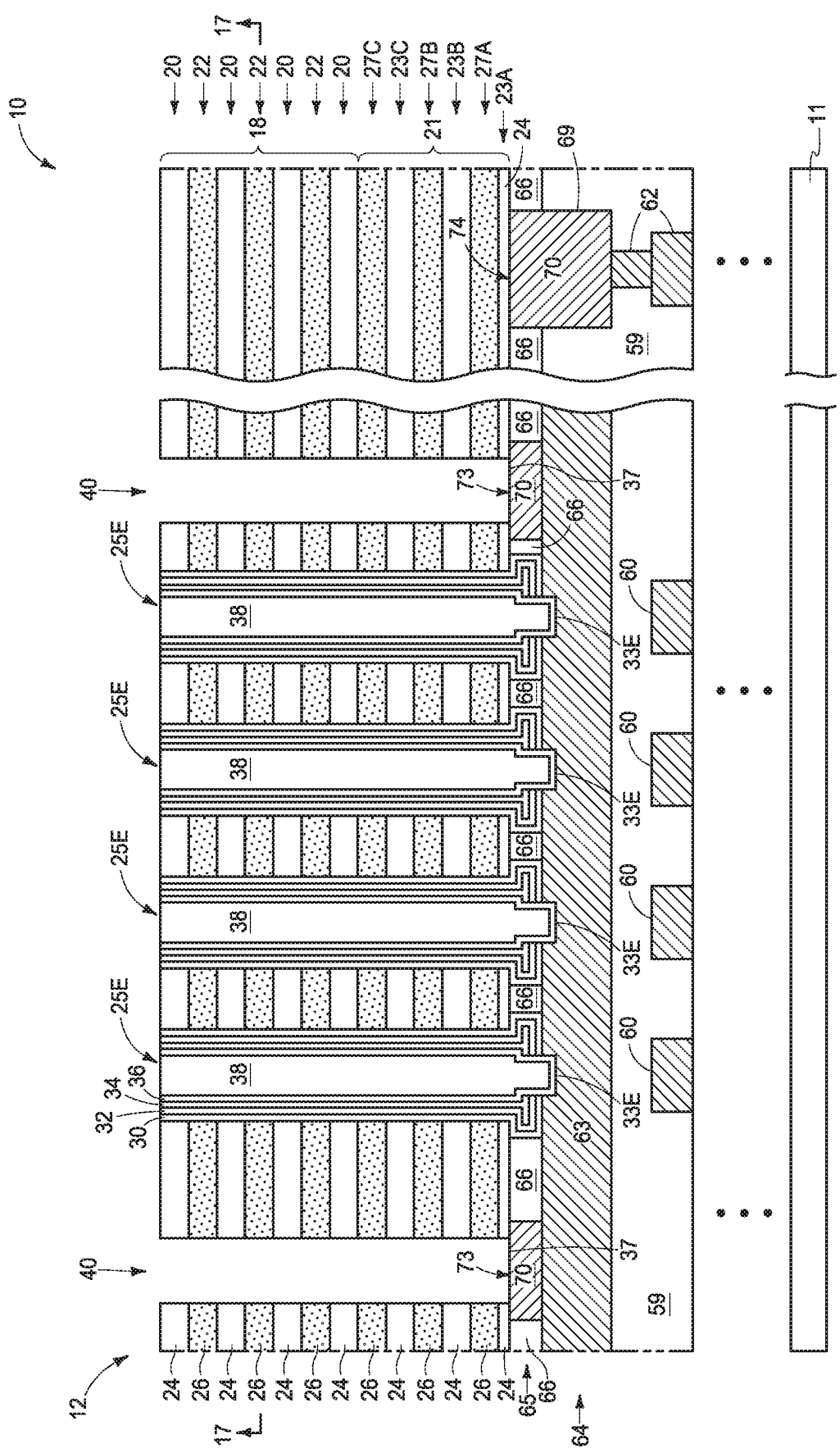
FIG. 18 is a view taken through line 18-18 in FIG. 17.
Figure 19:
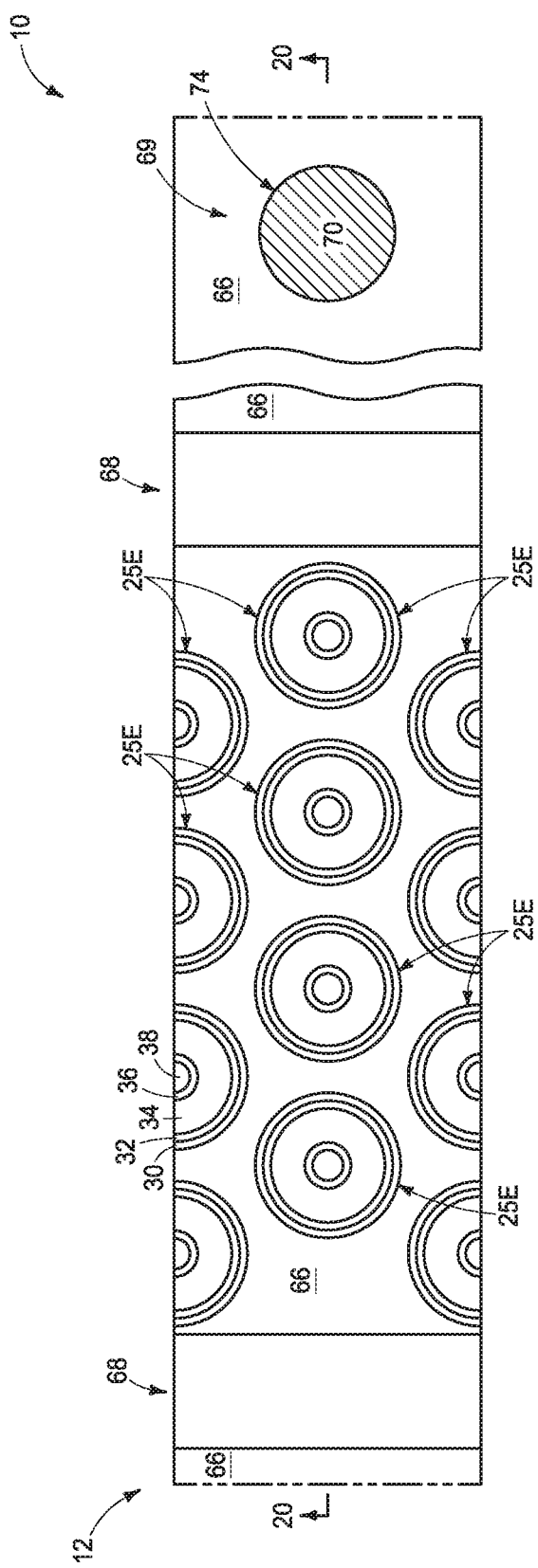
FIG. 19 is a view of the FIG. 17 substrate at a processing step subsequent to that shown by FIG. 17 and is taken through line 19-19 in FIG. 20.
Figure 20:
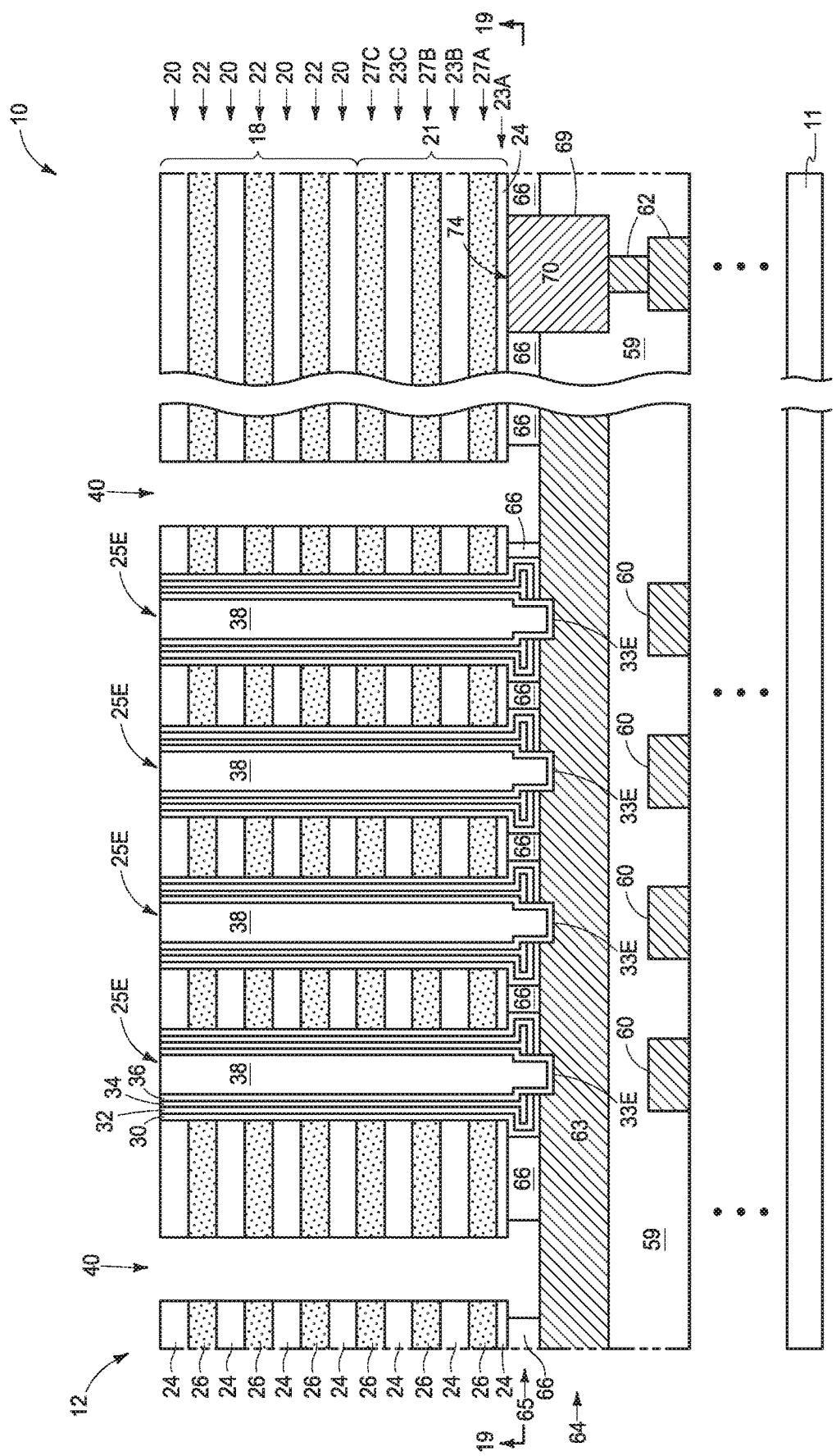
FIG. 20 is a view taken through line 20-20 in FIG. 19.

Referring to FIGS. 17 and 18, etching has been conducted through insulative tiers 20 and wordline tiers 22, and through stack 21 when present, to etch-stop material 70 of lines 73 to form horizontally-elongated trenches 40 that have individual bases 37 comprising etch-stop material 70 of individual lines 73. In one embodiment, lines 73 are non-sacrificial and remain in a finished construction of the memory array (not shown), for example where etch-stop material 70 is insulative. Alternately and as shown in FIGS. 19 and 20, lines 73 (not shown) are sacrificial and have been removed through individual horizontally-elongated trenches 40. Regardless, the etching through the insulative tiers and the wordline tiers to etch-stop material 70 of lines 73 may occur before or after forming channel material 36, and before or after forming channel openings 25/25E, with after such forming of channel material 36 being shown.

Figure 21:
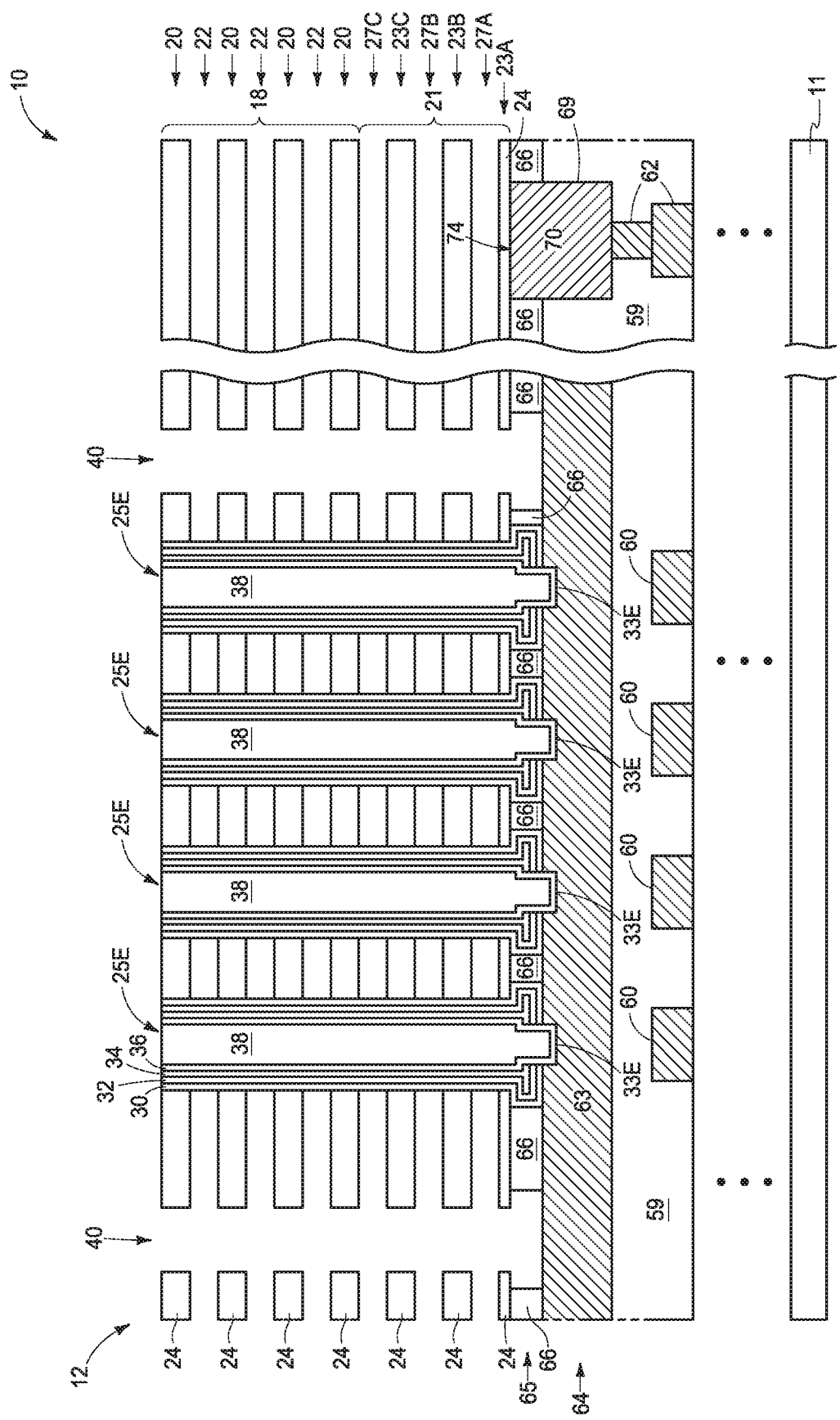
FIG. 21 is a view of the FIG. 20 substrate at a processing step subsequent to that shown by FIG. 20.

Referring to FIG. 21, first material 26 (not shown) of wordline tiers 22 and tiers 27* has been etched selectively relative to second material 24 (e.g., using liquid or vapor H$_3$PO$_4$ as a primary etchant where material 26 is silicon nitride and material 24 is silicon dioxide).

Figure 22:
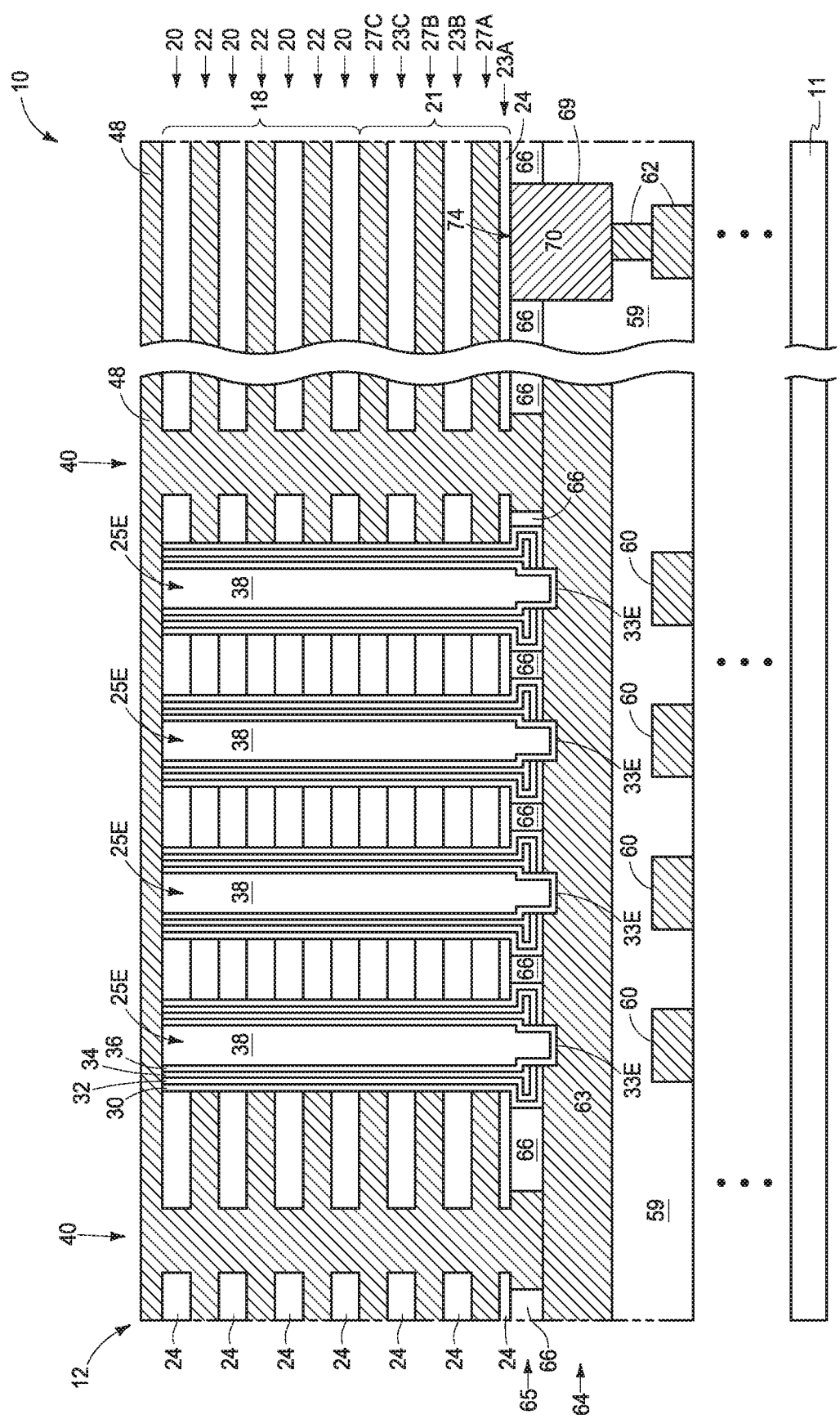
FIG. 22 is a view of the FIG. 21 substrate at a processing step subsequent to that shown by FIG. 21.

Referring to FIG. 22, conductive material 48 has been formed into wordline tiers 22 and tiers 27* through trenches 40 and which will comprise conductive material of the individual wordlines and other gate lines being formed. Any suitable conductive material may be used, for example one or both of metal material and/or conductively-doped semiconductor material.

Figure 23:
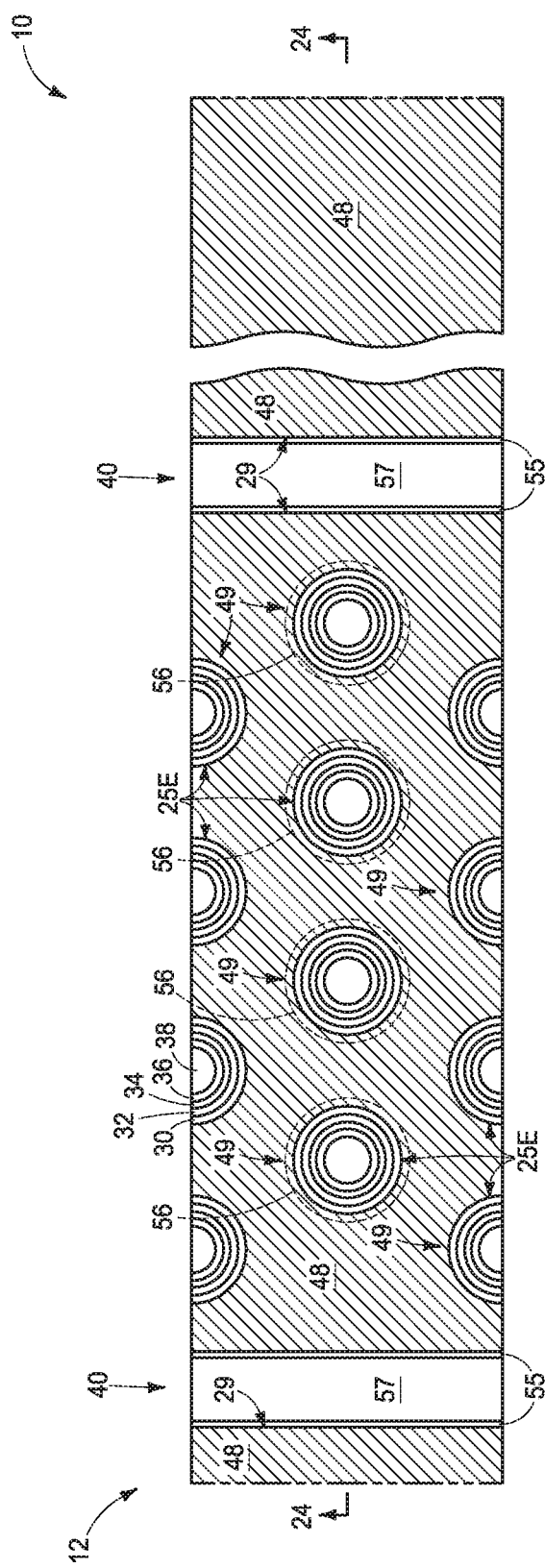
FIG. 23 is a view of the FIG. 22 substrate at a processing step subsequent to that shown by FIG. 22 and is taken through line 23-23 in FIG. 24.
Figure 24:
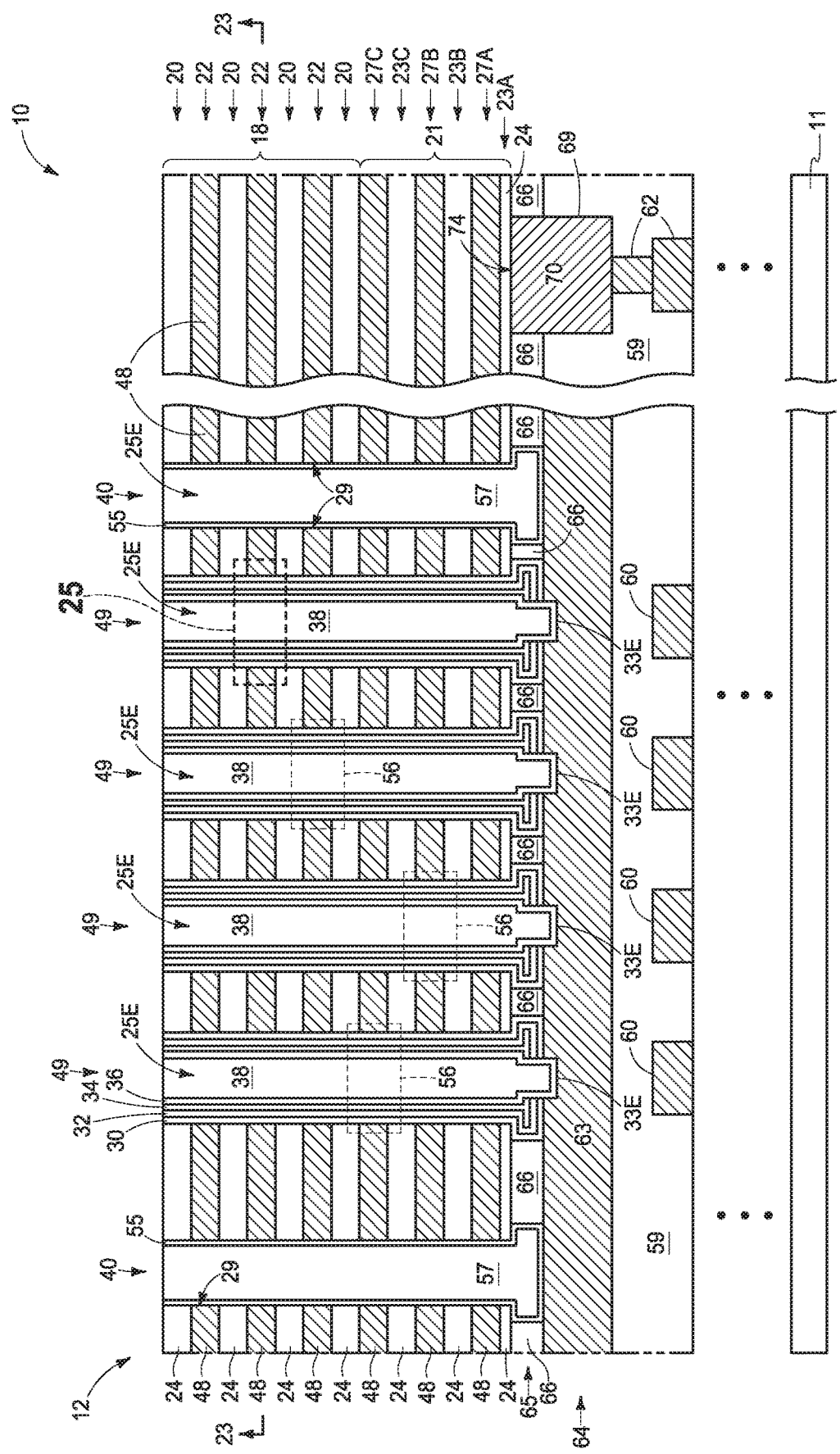
FIG. 24 is a view taken through line 24-24 in FIG. 23.
Figure 25:
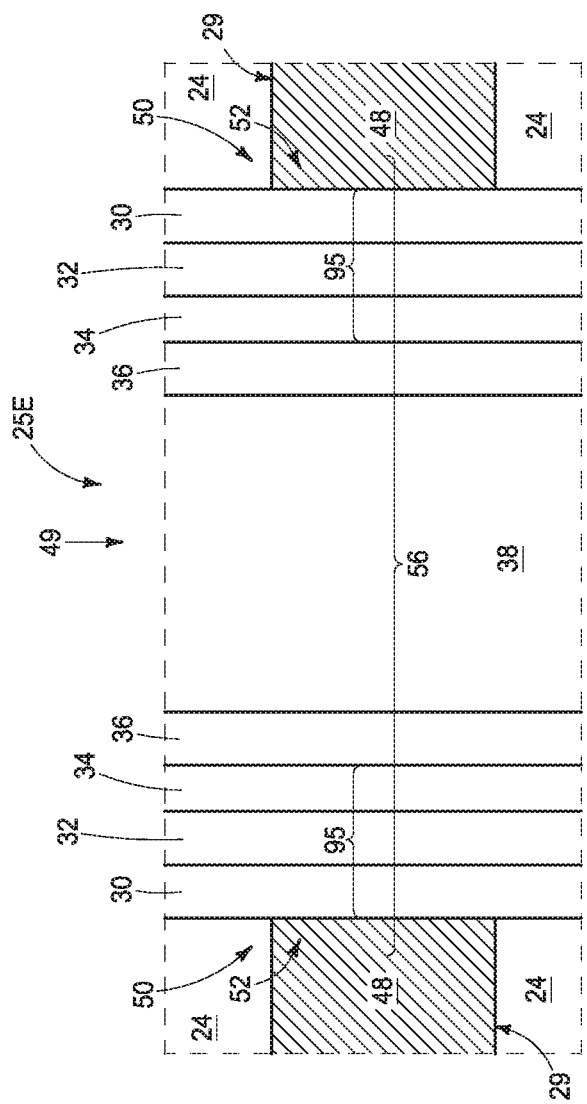
FIG. 25 is an enlarged view of a portion of FIG. 24.

Referring to FIGS. 23-25, conductive material 48 has been removed from individual trenches 40. Such has resulted in formation of wordlines 29 and elevationally-extending strings 49 of individual transistors and/or memory cells 56. Approximate locations of transistors and/or memory cells 56 are indicated with a bracket in FIG. 25 and some with dashed outlines in FIGS. 23 and 24, with transistors and/or memory cells 56 being essentially ring-like or annular in the depicted example. Conductive material 48 may be considered as having terminal ends 50 (FIG. 25) corresponding to control-gate regions 52 of individual transistors and/or memory cells 56. Control-gate regions 52 in the depicted embodiment comprise individual portions of individual wordlines 29. Materials 30, 32, and 34 may be considered as a memory structure 95 (FIG. 25) that is laterally between control-gate region 52 and channel material 36. Individual trenches 40 have been filed with material (e.g., 55 [dielectric, such as silicon dioxide or silicon nitride and e.g., 57 [polysilicon]).

A charge-blocking region (e.g., charge-blocking material 30) is between charge-storage material 32 and individual control-gate regions 52. A charge block may have the following functions in a memory cell: In a program mode, the charge block may prevent charge carriers from passing out of the charge-storage material (e.g., floating-gate material, charge-trapping material, etc.) toward the control gate, and in an erase mode the charge block may prevent charge carriers from flowing into the charge-storage material from the control gate. Accordingly, a charge block may function to block charge migration between the control-gate region and the charge-storage material of individual memory cells. An example charge-blocking region as shown comprises insulator material 30. By way of further examples, a charge-blocking region may comprise a laterally (e.g., radially) outer portion of the charge-storage material (e.g., material 32) where such charge-storage material is insulative (e.g., in the absence of any different-composition material between an insulative charge-storage material 32 and conductive material 48). Regardless, as an additional example, an interface of a charge-storage material and conductive material of a control gate may be sufficient to function as a charge-blocking region in the absence of any separate-composition-insulator material 30. Further, an interface of conductive material 48 with material 30 (when present) in combination with insulator material 30 may together function as a charge-blocking region, and as alternately or additionally may a laterally-outer region of an insulative charge-storage material (e.g., a silicon nitride material 32). An example material 30 is silicon dioxide and/or silicon nitride.

Figure 26:
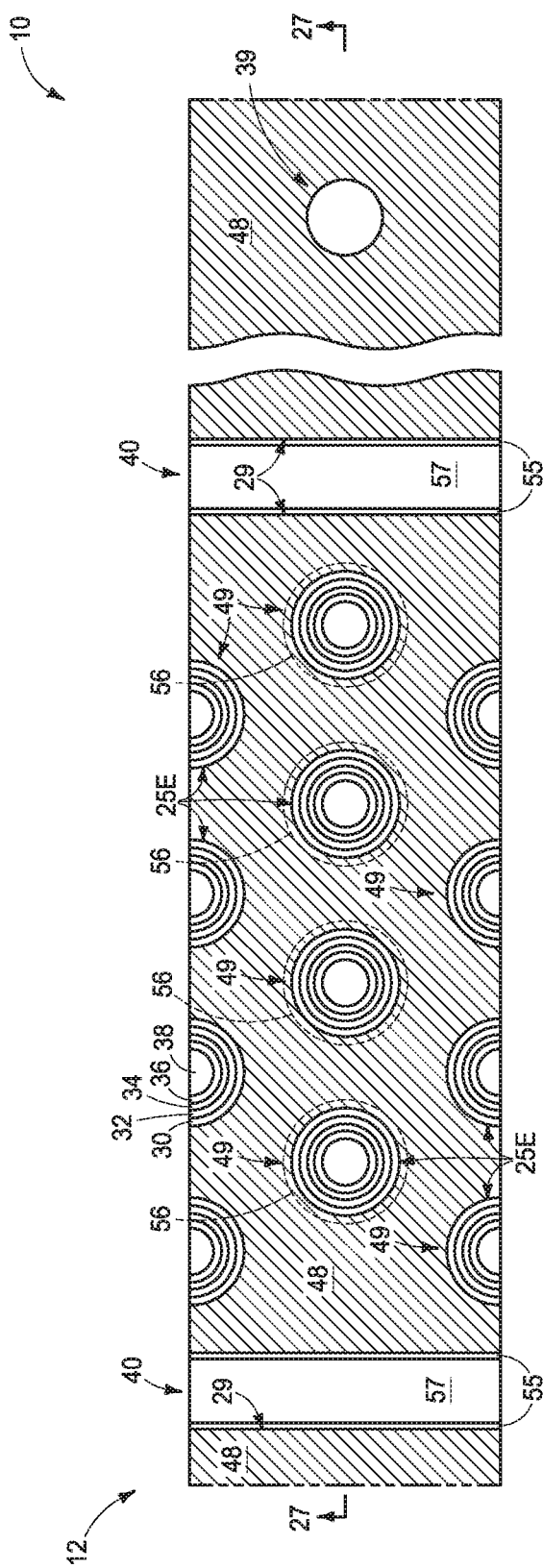
FIG. 26 is a view of the FIG. 23 substrate at a processing step subsequent to that shown by FIG. 23 and is taken through line 26-26 in FIG. 27.
Figure 27:
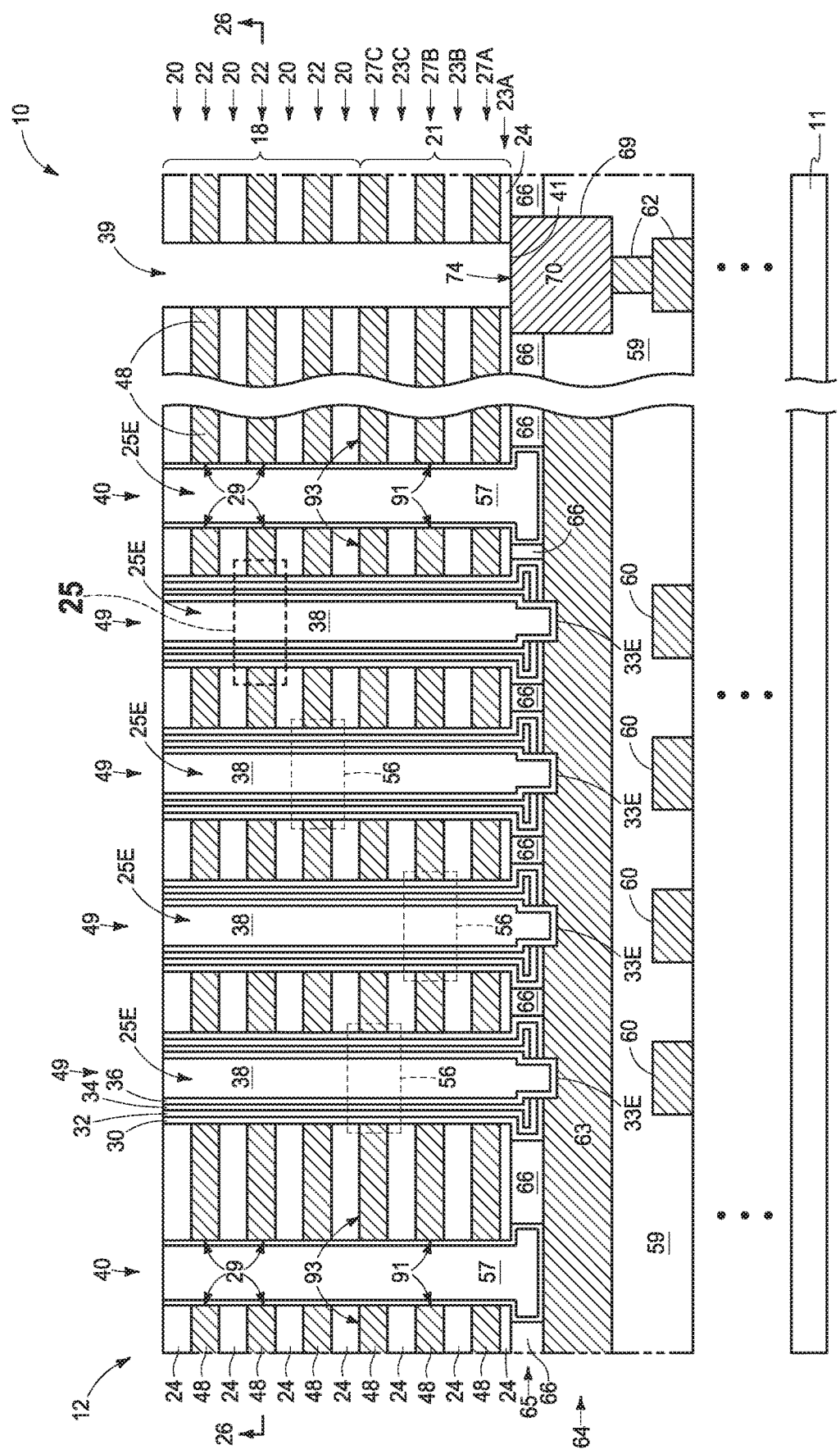
FIG. 27 is a view taken through line 27-27 in FIG. 26.

Referring to FIGS. 26 and 27, etching has been conducted through insulative tiers 20 and wordline tiers 22 to conductive etch-stop material 70 of individual non-sacrificial landing pads 74 to form TAV openings 39 that have individual bases 41 comprising conductive etch-stop material 70 of individual non-sacrificial landing pads 74. Alternately and more preferred, TAV openings 39 may be formed before (not shown) forming horizontally-elongated trenches 40 such that TAV openings 39 are etched through preferred silicon dioxide material 24 and preferred silicon nitride material 26 as opposed to through preferred silicon dioxide material 24 and conductive material 48.

Figure 28:
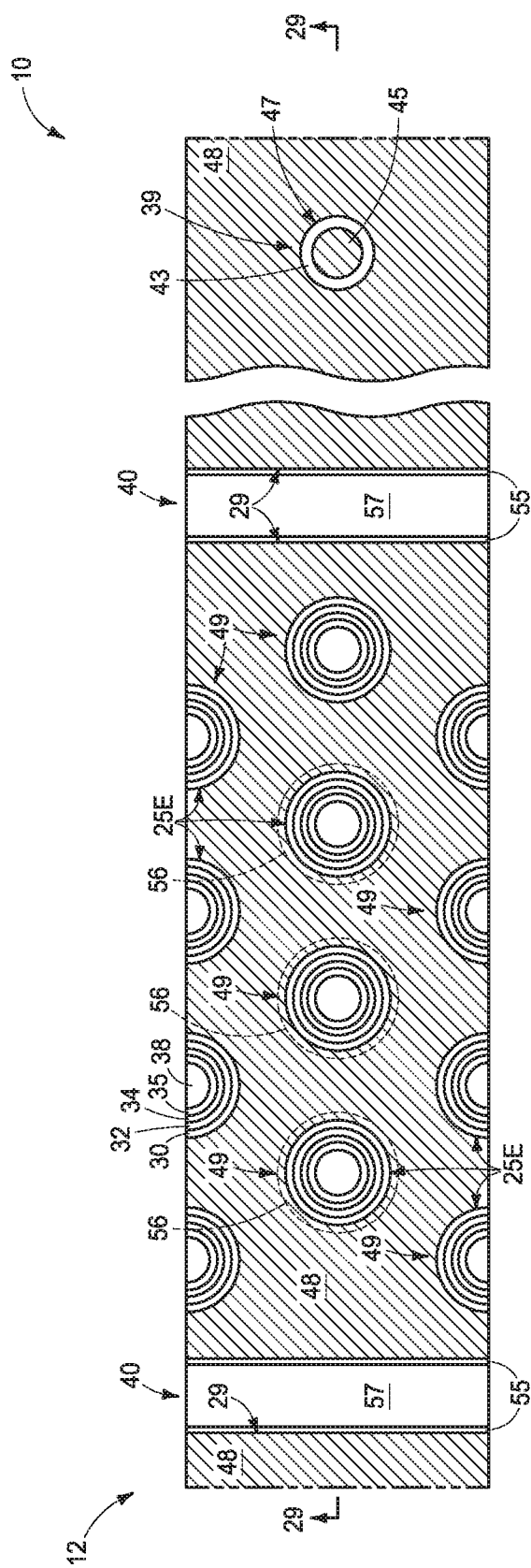
FIG. 28 is a view of the FIG. 26 substrate at a processing step subsequent to that shown by FIG. 26 and is taken through line 28-28 in FIG. 29.
Figure 29:
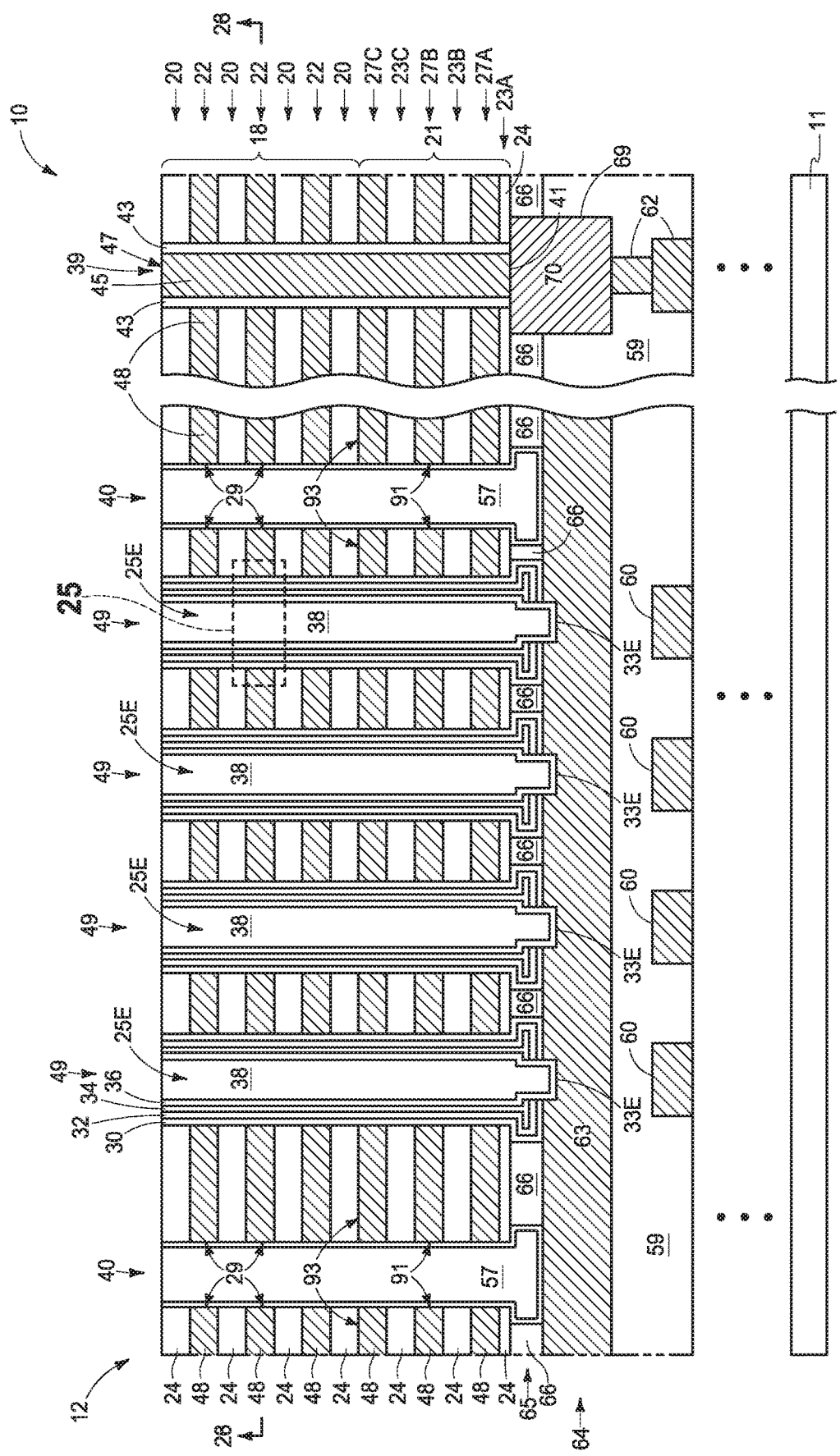
FIG. 29 is a view taken through line 29-29 in FIG. 28.

Referring to FIGS. 28 and 29, insulator material 43 (e.g., silicon nitride and/or silicon dioxide) and conductive material 45 (e.g., conductively-doped semiconductor material and/or metal material) has been formed in TAV openings 39 and directly electrically coupled to non-sacrificial landing pads 74 to form individual TAVs 47 in individual TAV openings 39.

As an alternate example, at least some of etch stop material 70 (regardless of whether conductive) in FIG. 27 could be removed and there-after conductive material 45 could be formed in individual TAV openings 39 openings to form individual TAVs. For example, and by way of example only, consider an embodiment wherein etch-stop material 70 comprises a radially-outer dielectric material (e.g., silicon dioxide) and a radially inner conductive material (e.g., a TiN lining and radially-central W). The conductive portion of material 70 of FIG. 27 could be etched away after forming TAV openings 39 thereto, leaving the radially-outer dielectric material. Then, insulator material 43 could be deposited, followed by removing the radially-outer dielectric material and insulator material 43 from the bases of individual TAV openings 39 openings, and followed by deposition of conductive material 45. Any other attribute(s) or aspect(s) as shown and/or described herein with respect to other embodiments may be used.

Figure 30:
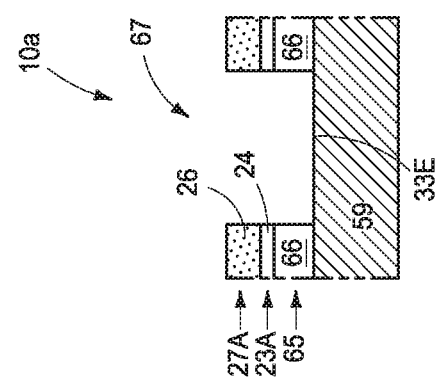
FIG. 30 is a diagrammatic cross-sectional view of a portion of a substrate in process in accordance with an embodiment of the invention.

An alternate example embodiment is shown and described with reference to FIGS. 30 and 31 and a construction 10a. Like numerals from the above-described embodiments have been used where appropriate, with some construction difference being indicated with the suffix "a". Referring to FIG. 30, tier 23A (optional) and conductor tier 27A there-above have been formed prior to forming opening 67, and then opening 67 has been formed through tiers 27A, 23A and 65. Such may also occur, for example, with respect to openings 68 (not shown), and/or opening 69 to reach component 62 (not shown). Accordingly, sacrificial islands 72 (not shown) of FIGS. 5 and 6 (and in one embodiment lines 73 and/or non-sacrificial landing pads 74 of FIGS. 5 and 6) will be formed taller than as shown in FIGS. 5 and 6.

Figure 31:
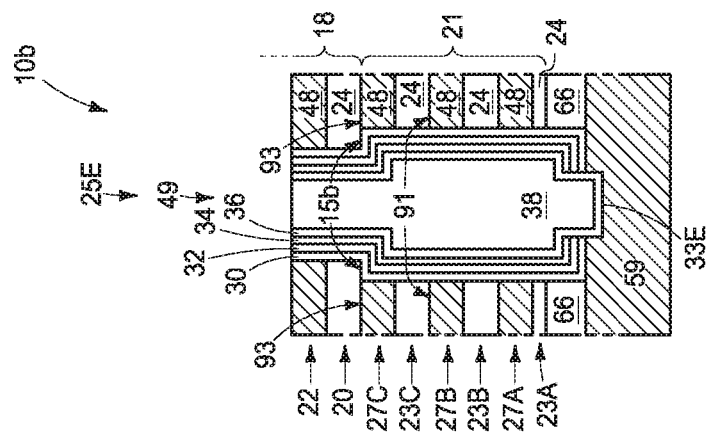
FIG. 31 is a view of the FIG. 30 substrate at a processing step subsequent to that shown by FIG. 30.

Referring to FIG. 31, materials 30, 32, 34, 36, and 38 have been formed analogously to that described above where, for example and in one embodiment, as a minimum charge-blocking material 30 has been formed in annular recess 15a of extended-channel openings 25E. Any other attribute(s) or aspect(s) as shown and/or described herein with respect to other embodiments may be used.

Figure 32:
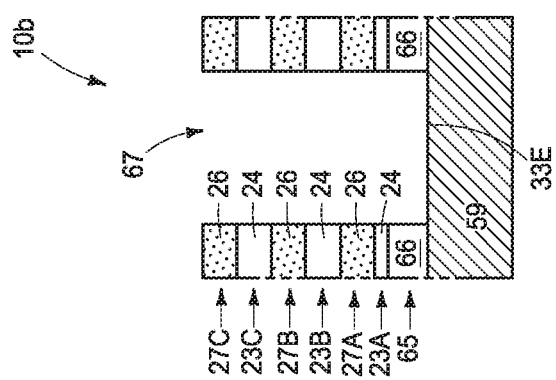
FIG. 32 is a diagrammatic cross-sectional view of a portion of a substrate in process in accordance with an embodiment of the invention.
Figure 33:
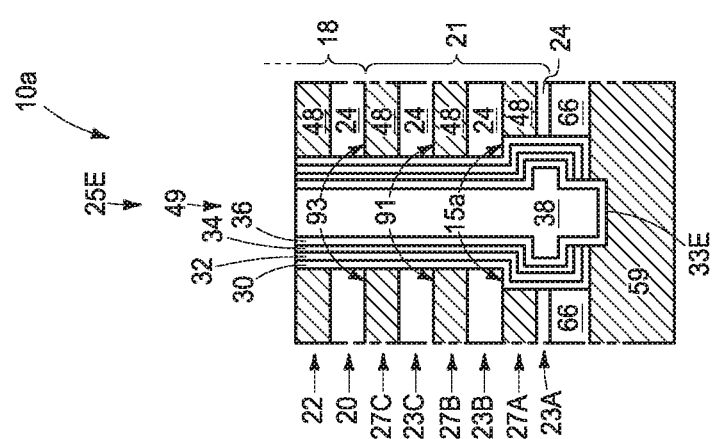
FIG. 33 is a view of the FIG. 32 substrate at a processing step subsequent to that shown by FIG. 32.

FIGS. 32 and 33 show alternate example processing with respect to a construction 10b. Like numeral from the above-described embodiments have been used where appropriate, with some construction difference being indicated with the suffix "b". Referring to FIG. 32, tiers 23A (optional), 27A, 23B, 27B, 23C, and 27C have been formed prior to forming opening 67, and then opening 67 has been formed through such tiers and 65. Such may also occur, for example, with respect to openings 68 and/or 69 (not shown). Accordingly, sacrificial islands 72 (not shown) of FIGS. 5 and 6 (and in one embodiment lines 73 and/or non-sacrificial landing pads 74 of FIGS. 5 and 6) will be formed taller than as shown in FIGS. 5 and 6 and as described above with respect to FIGS. 30 and 31.

Referring to FIG. 33, materials 30, 32, 34, 36, and 38 have been formed analogously to that described above where, for example and in one embodiment, as a minimum charge-blocking material 30 has been formed in annular recess 15b of extended-channel openings 25E. Any other attribute(s) or aspect(s) as shown and/or described herein with respect to other embodiments may be used.

Embodiments of the invention encompass memory arrays independent of method of manufacture. Nevertheless, such memory array may have any of the attributes as described herein in method embodiments. Likewise, the above-described method embodiments may incorporate and form any of the attributes described with respect to device embodiments.

In one embodiment, a memory array (e.g., 12) comprises a vertical stack (e.g., 18, 21, plus material 63 there-below) comprising a tier (e.g., 64) comprising conductor material (e.g., 63). A tier (e.g., 65) comprising insulator material (e.g., 66) is above the tier comprising conductor material. Alternating insulative tiers (e.g., 20) and wordline tiers (e.g., 22) are above the tier comprising the insulator material. The wordline tiers comprise gate regions (e.g., 52) of individual memory cells (e.g., 56). The gate regions individually comprise part of a wordline (e.g., 29) in individual of the wordline tiers. Channel material (e.g., 36) extends elevationally through the insulative tiers, the wordline tiers, and the tier comprising the insulator material. The channel material is directly electrically coupled to the conductor material of the tier comprising the conductor material. Individual memory cells (e.g., 56) comprise a memory structure (e.g., 95) between the gate region and the channel material. The memory structure comprises a charge-blocking region (e.g., 30 when present, or a portion of material 32 when not present) radially inward of individual of the gate regions. A charge-storage region (e.g., 32) is radially inward of individual of the charge-blocking regions. Insulative charge-passage material (e.g., 34) is radially inward of individual of the charge-storage regions. The charge-blocking regions comprise a charge-blocking material (e.g., 30 when present, or a portion of material 32 when not present). An annular recess (e.g., 15, 15*a*, 1.5*b*) is in the tier comprising the insulator material. The annular recess projects radially-outward to be directly under conductive material (e.g., 48) that is in the individual wordlines (e.g., with some material 24 being above the annular recess). The charge-blocking material is in the annular recess that is in the tier comprising the insulator material and is directly under the conductive material that is in the individual wordline tiers.

In one embodiment, the conductor material comprises conductively-doped semiconductor material above metal material. In one embodiment, the charge-storage region comprises charge storage material and such is in the annular recess that is in the tier comprising the insulator material and is directly under the conductive material that is in the individual wordline tiers. In one such embodiment, the insulative charge-passage material is in the annular recess that is in the tier comprising the insulator material and is directly under the conductive material that is in the wordline tiers.

In one embodiment, the annular recess (e.g., 15*a*, 15*b*) extends to above the tier comprising insulator material and the charge-blocking material is in the annular recess above the tier comprising the insulator material. In one such embodiment, a tier (e.g., any of 27A, 27B, 27C) comprising conducting material (e.g., 48) is between: (a) the alternating insulative tiers and wordline tiers, and (b) the tier comprising conductor material. The annular recess extends into the tier comprising the conducting material and the charge-Hocking material that is in the annular recess is directly against the conducting material of the tier comprising conducting material.

In one embodiment, the memory array comprises a tier comprising conducting material between (a) the alternating insulative tiers and wordline tiers, and (b) the tier comprising conductor material. The annular recess is everywhere below the tier comprising the conducting material (e.g., FIG. 29). In one such embodiment (e.g., FIG. 29), the annular recess is everywhere spaced from a bottom-most surface of the conducting material of the tier comprising the conducting material. The charge-blocking material that is in the annular recess thereby is not directly against the bottom-most surface of the conducting material of the tier comprising the conducting material.

Any other attribute(s) or aspect(s) as shown and/or described herein with respect to other embodiments may be used.

In one embodiment, a memory array (e.g., 12) comprises a vertical stack (e.g., 18, 21, plus material 63 there-below) comprising a tier (e.g., 64) comprising conductor material (e.g., 63). A tier (e.g., 65) comprising insulator material (e.g., 66) is above the tier comprising conductor material. A tier (e.g., 279) comprising conductive material (e.g., 48) is above the tier comprising insulator material. Alternating insulative tiers (e.g., 20) and wordline tiers (e.g., 22) are above the tier comprising the insulator material. The wordline tiers comprise gate regions (e.g., 52) of individual memory cells (e.g., 56). The gate regions individually comprise part of a wordline (e.g., 29) in individual of the wordline tiers. Channel material (e.g., 36) extends elevationally through the insulative tiers, the wordline tiers, and the tier comprising the insulator material. The channel material is directly electrically coupled to the conductor material of the tier comprising the conductor material. Individual memory cells (e.g., 56) comprise a memory structure (e.g., 95) between the gate region and the channel material. The memory structure comprises a charge-blocking region (e.g., 30 when present, or a portion of material 32 when not present) radially inward of individual of the gate regions. A charge-storage region (e.g., 32) is radially inward of individual of the charge-blocking regions. Insulative charge-passage material (e.g., 34) is radially inward of individual of the charge-storage regions. The charge-blocking regions comprise a charge-blocking material (e.g., 30 when present, or a portion of material 32 when not present). An annular recess (e.g., 15, 15*a*, 15*h*) is in the tier comprising the insulator material and in the tier comprising the conductive material. The annular recess projects radially-outward to be directly under conducting material (e.g., 48) that is in the individual wordlines. The charge-blocking material is in the annular recess that is in the tier comprising the insulator material and in the tier comprising the conductive material and is directly under the conducting material that is in the individual wordline tiers.

In one embodiment, the tier comprising the conductive material comprises a select gate source control line (e.g., 91 in tier 27B in FIGS. 27, 29, 31 and 33). In one embodiment, the tier comprising the conductive material does not comprise a select gate source control line (e.g., conductive material in tier 27A). The embodiment of FIGS. 27, 29, 31 and 33 show examples wherein, for example, conductive material 48 in tier 27B may be a select gate source control line. As an alternate example embodiment, conductive material 48 in tier 27B may comprise three separate tiers having insulative tiers there-between (not shown), and wherein such gates are directly electrically coupled in parallel to collectively function as a single select gate source control line. Additionally, example conductive tier 27A may provide primary purpose and function when erasing a memory status in a memory cell string 49 for purpose of inducing gate induced drain leakage. Example conductive tier 27C may comprise and function as a dummy wordline 93 (FIGS. 27, 29, 31 and 33), meaning such a tier does not contain operable memory cells as part of string 49 but is operable as a gate for causing channel material 36 radially there-adjacent to be conductive in operation.

In one embodiment, there are multiple of the tiers (e.g., 27A, 27B, 27C) comprising the conductive material above the tier comprising the insulator material and which are below the alternating insulative tiers and wordline tiers. The annular recess (e.g., 15*b*) is in such multiple of such tiers comprising the conductive material. In one such embodiment, at least one of such multiple of such tiers (e.g., 27B) comprises the conductive material comprising a select gate source control line. In one such embodiment, at least one of such multiple of such tiers comprising the conductive material does not comprise select gate source control line. In one such embodiment, at least one of such multiple of such tiers comprising the conductive material comprises a select gate source control line. Another at least one of such multiple of such tiers comprising the conductive material does not comprise a select gate source control line.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) devotionally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector. In some embodiments, any component, feature, and/or region that extends elevationally extends vertically or within 10° of vertical.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprises forming a tier comprising conductor material above a substrate. Sacrificial islands comprising etch-stop material are formed directly above the conductor material of the tier comprising the conductor material. A stack comprising vertically-alternating insulative tiers and wordline tiers is formed above the sacrificial islands and the tier comprising the conductor material. Etching is conducted through the insulative tiers and the wordline tiers to the etch-stop material of individual of the sacrificial islands to form channel openings that have individual bases comprising the etch-stop material. The sacrificial islands are removed through individual of the channel openings to extend the individual channel openings to the tier comprising the conductor material. Channel material is formed in the extended-channel openings to the tier comprising the conductor material. The channel material is electrically coupled with the conductor material of the tier comprising the conductor material.

In some embodiments, a method used in forming a memory array comprises forming a tier comprising conductor material above a substrate. Sacrificial islands are formed that are spaced from and between lines. The sacrificial islands and the lines are directly above the conductor material of the tier comprising the conductor material. The sacrificial islands and the lines comprise etch-stop material. A stack is formed that comprises vertically-alternating insulative tiers and wordline tiers above the sacrificial islands, the lines, and the tier comprising the conductor material. Etching is conducted through the insulative tiers and the wordline tiers to the etch-stop material of individual of the sacrificial islands to form channel openings that have individual bases comprising the etch-stop material. The sacrificial islands are removed through individual of the channel openings to extend the individual channel openings to the tier comprising the conductor material. Channel material is formed in the extended-channel openings to the tier comprising the conductor material. The channel material is electrically coupled with the conductor material of the tier comprising the conductor material. Etching is conducted through the insulative tiers and the wordline tiers to the etch-stop material of the lines to form horizontally-elongated trenches that have individual bases comprising the etch-stop material of individual of the lines.

In some embodiments, a method used in forming a memory array comprises forming a tier comprising conductor material above a substrate. Sacrificial islands are formed that are spaced from and between non-sacrificial lines. The sacrificial islands and the non-sacrificial lines are directly above the conductor material of the tier comprising the conductor material. The sacrificial islands and the non-sacrificial lines comprise insulative etch-stop material. A stack is formed that comprises vertically-alternating insulative tiers and wordline tiers above the sacrificial islands, the non-sacrificial lines, and the tier comprising the conductor material. Etching is conducted through the insulative tiers and the wordline tiers to the insulative etch-stop material of individual of the sacrificial islands to form channel openings that have individual bases comprising the insulative etch-stop material. The sacrificial islands are removed through individual of the channel openings to extend the individual channel openings to the tier comprising the conductor material. Channel material is formed in the extended-channel openings to the tier comprising the conductor material. The channel material is electrically coupled with the conductor material of the tier comprising the conductor material. Etching is conducted through the insulative tiers and the wordline tiers to the insulative etch-stop material of the non-sacrificial lines to form horizontally-elongated trenches that have individual bases comprising the insulative etch-stop material of individual of the non-sacrificial lines. The non-sacrificial lines remain in a finished construction of the memory array.

In some embodiments, a method used in forming a memory array and conductive through-array-vias (TAV's) comprises forming a tier comprising conductor material above a substrate. Sacrificial islands and non-sacrificial landing pads are formed. The sacrificial islands are directly above the conductor material of the tier comprising the conductor material. The sacrificial islands and the non-sacrificial landing pads comprise conductive etch-stop material that forms a conductive path from their respective tops to their respective bottoms. A stack is formed that comprises vertically-alternating insulative tiers and wordline tiers above the sacrificial islands, the non-sacrificial landing pads, and the tier comprising the conductor material. Etching is conducted through the insulative tiers and the wordline tiers to the conductive etch-stop material of individual of the sacrificial islands to form channel openings that have individual bases comprising the conductive etch-stop material. The sacrificial islands are removed through individual of the channel openings to extend the individual channel openings to the tier comprising the conductor material. Channel material is formed in the extended-channel openings to the tier comprising the conductor material. The channel material is electrically coupled with the conductor material of the tier comprising the conductor material. Etching is conducted through the insulative tiers and the wordline tiers to the conductive etch-stop material of the non-sacrificial landing pads to form TAV openings that have individual bases comprising the conductive etch-stop material of individual of the non-sacrificial landing pads. Conductive material is formed in the TAV openings to be directly electrically coupled to the non-sacrificial landing pads to form individual TAVs in individual of the TAV openings.

In some embodiments, a method used in forming a memory array and conductive through-array-vias (TAVs) comprises forming a tier comprising conductor material above a substrate. Landing pads and sacrificial islands are formed, with the sacrificial islands being directly above the conductor material of the tier comprising the conductor material. The landing pads and the sacrificial islands comprise etch-stop material. A stack comprising vertically-alternating insulative, tiers and wordline tiers is formed above the landing pads, the sacrificial islands, and the tier comprising the conductor material. Etching is conducted through the insulative tiers and the wordline tiers to the etch-stop material of individual of the sacrificial islands to form channel openings that have individual bases comprising the etch-stop material. The sacrificial islands are removed through individual of the channel openings to extend the individual channel openings to the tier comprising the conductor material. Channel material is formed in the extended-channel openings to the tier comprising the conductor material. The channel material is electrically coupled with the conductor material of the tier comprising the conductor material. Etching is conducted through the insulative tiers and the wordline tiers to the etch-stop material of the landing pads to form TAV openings that have individual bases comprising the etch-stop material of individual of the non-sacrificial landing pads. At least some of the etch stop material is removed and there-after conductive material is formed in the TAV openings to form individual TAVs in individual of the TAV openings.

In some embodiments, a memory array comprises a vertical stack comprising a tier comprising conductor material, a tier comprising insulator material above the tier comprising conductor material, and alternating insulative tiers and wordline tiers above the tier comprising the insulator material. The wordline tiers comprise gate regions of individual memory cells. The gate regions individually comprise part of a wordline in individual of the wordline tiers. Channel material extends elevationally through the insulative tiers, the wordline tiers, and the tier comprising the insulator material. The channel material is directly electrically coupled to the conductor material of the tier comprising the conductor material. The individual memory cells comprise a memory structure between the gate region and the channel material. The memory structure comprises a charge-blocking region radially inward of individual of the gate regions, a charge-storage region radially inward of individual of the charge-blocking regions, and insulative charge-passage material radially inward of individual of the charge-storage regions. The charge-blocking regions comprises a charge-blocking material. An annular recess is in the tier comprising the insulator material. The annular recess projects radially-outward to be directly under conductive material that is in the individual wordline tiers. The charge-blocking material is in the annular recess that is in the tier comprising the insulator material and is directly under the conductive material that is in the individual wordline tiers.

In some embodiments, a memory array comprises a vertical stack comprising a tier comprising conductor material, a tier comprising insulator material above the tier comprising conductor material, a tier comprising conductive material above the tier comprising insulator material, alternating insulative tiers and wordline tiers above the tier comprising the conductive material. The wordline tiers comprise gate regions of individual memory cells. The gate regions individually comprise part of a wordline in individual of the wordline tiers. Channel material extends elevationally through the insulative tiers, the wordline tiers, the tier comprising the conductive material, and the tier comprising the insulator material. The channel material is directly electrically coupled to the conductor material of the tier comprising the conductor material. The individual memory cells comprising a memory structure between the gate region and the channel material. The memory structure comprises a charge-blocking region radially inward of individual of the gate regions, a charge-storage region radially inward of individual of the charge-blocking regions, and insulative charge-passage material radially inward of individual of the charge-storage regions. The charge-blocking regions comprise a charge-blocking material. An annular recess is in the tier comprising the insulator material and in the tier comprising the conductive material. The annular recess projects radially-outward to be directly under conducting material that is in the individual wordline tiers. The charge-blocking material is in the annular recess that is in the tier comprising the insulator material and in the tier comprising the conductive material and is directly under the conducting material that is in the individual wordline tiers.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array, comprising:
   forming a tier comprising conductor material above a substrate;
   forming sacrificial islands comprising etch-stop material directly above the conductor material of the tier comprising the conductor material;
   forming a stack comprising vertically-alternating insulative tiers and wordline tiers above the sacrificial islands and the tier comprising the conductor material;
   etching through the insulative tiers and the wordline tiers to the etch-stop material of individual of the sacrificial islands to form channel openings that have individual bases comprising the etch-stop material;
   removing the sacrificial islands through individual of the channel openings to extend the individual channel openings to the tier comprising the conductor material; and
   forming channel material in the extended-channel openings to the tier comprising the conductor material, the channel material being electrically coupled with the conductor material of the tier comprising the conductor material.

2. The method of claim 1 wherein the etch-stop material comprises conductive material.

3. The method of claim 1 wherein the etch-stop material comprises a radially outer dielectric material and a radially inner conductive material.

4. The method of claim 1 wherein the individual islands are diametrically larger than the individual channel openings prior to said removing.

5. The method of claim 1 wherein the sacrificial islands and the etch-stop material are in a tier comprising insulator material of different composition from that of the etch-stop material.

6. The method of claim 5 wherein the individual islands are diametrically larger than the individual channel openings prior to said removing, said removing forming an annular recess in the tier comprising the insulator material and that projects radially-outward, and further comprising forming charge-blocking material in the annular recess prior to forming the channel material.

7. The method of claim 6 comprising forming charge-storage material in the annular recess prior to forming the channel material.

8. The method of claim 7 comprising forming insulative charge-passage material in the annular recess prior to forming the channel material.

9. The method of claim 6 wherein none of the channel material is formed in the annular recess.

10. The method of claim 1 comprising:
    forming a tier comprising insulator material before forming the sacrificial islands, the insulator material being of different composition from that of the etch-stop material;
    forming a conductor tier above the tier comprising the insulator material before forming the stack; and
    forming the sacrificial islands in the conductor and in the tier comprising the insulator material.

11. The method of claim 10 wherein the individual islands are diametrically larger than the individual channel openings prior to said removing, said removing forming an annular recess in the tier comprising the insulator material and in the conductor tier, the annular recess projecting radially-outward, and further comprising forming charge-blocking material in the annular recess prior to forming the channel material.

12. The method of claim 10 comprising:
forming multiple of said conductor tier above the tier comprising the insulator material; and
forming the sacrificial islands in said multiple of said conductor tiers above the tier comprising the insulator material.

13. The method of claim 12 wherein the individual islands are diametrically larger than the individual channel openings prior to said removing, said removing forming an annular recess in the tier comprising the insulator material and said multiple of said conductor tiers above the tier comprising the insulator material, the annular recess projecting radially-outward, and further comprising forming charge-blocking material in the annular recess prior to forming the channel material.

14. A method used in forming a memory array, comprising:
forming a tier comprising conductor material above a substrate;
forming sacrificial islands spaced from and between lines, the sacrificial islands and the sacrificial lines being directly above the conductor material of the tier comprising the conductor material, the sacrificial islands and the lines comprising etch-stop material;
forming a stack comprising vertically-alternating insulative tiers and wordline tiers above the sacrificial islands, the lines, and the tier comprising the conductor material;
etching through the insulative tiers and the wordline tiers to the etch-stop material of individual of the sacrificial islands to form channel openings that have individual bases comprising the etch-stop material;
removing the sacrificial islands through individual of the channel openings to extend the individual channel openings to the tier comprising the conductor material;
forming channel material in the extended-channel openings to the tier comprising the conductor material, the channel material being electrically coupled with the conductor material of the tier comprising the conductor material; and
etching through the insulative tiers and the wordline tiers to the etch-stop material of the lines to form horizontally-elongated trenches that have individual bases comprising the etch-stop material of individual of the lines.

15. The method of claim 14 wherein the sacrificial islands and the lines comprise conductive etch-stop material and the lines are sacrificial, and further comprising removing the conductive sacrificial lines through individual of the horizontally-elongated trenches.

16. The method of claim 14 wherein the sacrificial islands and the lines comprise insulative etch-stop material and the lines are sacrificial, and further comprising removing the insulative sacrificial lines through individual of the horizontally-elongated trenches.

17. The method of claim 14 wherein the sacrificial islands and the lines comprise insulative etch-stop material.

18. The method of claim 14 wherein the etching through the insulative tiers and the wordline tiers to the etch-stop material of the sacrificial lines occurs after the forming of the channel material.

19. A method used in forming a memory array, comprising:
forming a tier comprising conductor material above a substrate;
forming sacrificial islands spaced from and between non-sacrificial lines, the sacrificial islands and the non-sacrificial lines being directly above the conductor material of the tier comprising the conductor material, the sacrificial islands and the non-sacrificial lines comprising insulative etch-stop material;
forming a stack comprising vertically-alternating insulative tiers and wordline tiers above the sacrificial islands, the non-sacrificial lines, and the tier comprising the conductor material;
etching through the insulative tiers and the wordline tiers to the insulative etch-stop material of individual of the sacrificial islands to form channel openings that have individual bases comprising the insulative etch-stop material;
removing the sacrificial islands through individual of the channel openings to extend the individual channel openings to the tier comprising the conductor material;
forming channel material in the extended-channel openings to the tier comprising the conductor material, the channel material being electrically coupled with the conductor material of the tier comprising the conductor material;
etching through the insulative tiers and the wordline tiers to the insulative etch-stop material of the non-sacrificial lines to form horizontally-elongated trenches that have individual bases comprising the insulative etch-stop material of individual of the non-sacrificial lines, the non-sacrificial lines remaining in a finished construction of the memory array.

20. A method used in forming a memory array and conductive through-array-vias (TAVs), comprising:
forming a tier comprising conductor material above a substrate;
forming sacrificial islands and non-sacrificial landing pads, the sacrificial islands being directly above the conductor material of the tier comprising the conductor material, the sacrificial islands and the non-sacrificial landing pads comprising conductive etch-stop material forming a conductive path from their respective tops to their respective bottoms;
forming a stack comprising vertically-alternating insulative tiers and wordline tiers above the sacrificial islands, the non-sacrificial landing pads, and the tier comprising the conductor material;
etching through the insulative tiers and the wordline tiers to the conductive etch-stop material of individual of the sacrificial islands to form channel openings that have individual bases comprising the conductive etch-stop material;
removing the sacrificial islands through individual of the channel openings to extend the individual channel openings to the tier comprising the conductor material;
forming channel material in the extended-channel openings to the tier comprising the conductor material, the channel material being electrically coupled with the conductor material of the tier comprising the conductor material;
etching through the insulative tiers and the wordline tiers to the conductive etch-stop material of the non-sacrificial landing pads to form TAV openings that have individual bases comprising the conductive etch-stop material of individual of the non-sacrificial landing pads; and
forming conductive material in the TAV openings directly electrically coupled to the non-sacrificial landing pads to form individual TAVs in individual of the TAV openings.

21. A method used in forming a memory array and conductive through-array-vias (TAVs), comprising:
- forming a tier comprising conductor material above a substrate;
- forming landing pads and sacrificial islands, the sacrificial islands being directly above the conductor material of the tier comprising the conductor material, the landing pads and the sacrificial islands comprising etch-stop material;
- forming a stack comprising vertically-alternating insulative tiers and wordline tiers above the landing pads, the sacrificial islands, and the tier comprising the conductor material;
- etching through the insulative tiers and the wordline tiers to the etch-stop material of individual of the sacrificial islands to form channel openings that have individual bases comprising the etch-stop material;
- removing the sacrificial islands through individual of the channel openings to extend the individual channel openings to the tier comprising the conductor material;
- forming channel material in the extended-channel openings to the tier comprising the conductor material, the channel material being electrically coupled with the conductor material of the tier comprising the conductor material;
- etching through the insulative tiers and the wordline tiers to the etch-stop material of the landing pads to form TAV openings that have individual bases comprising the etch-stop material of individual of the non-sacrificial landing pads; and
- removing at least some of the etch stop material and there-after forming conductive material in the TAV openings to form individual TAVs in individual of the TAV openings.

22. A memory array comprising:
- a vertical stack comprising:
  - a tier comprising conductor material;
  - a tier comprising insulator material above the tier comprising conductor material; and
  - alternating insulative tiers and wordline tiers above the tier comprising the insulator material, the wordline tiers comprising gate regions of individual memory cells, the gate regions individually comprising part of a wordline in individual of the wordline tiers;
- channel material extending elevationally through the insulative tiers, the wordline tiers, and the tier comprising the insulator material; the channel material being directly electrically coupled to the conductor material of the tier comprising the conductor material;
- the individual memory cells comprising a memory structure between the gate region and the channel material; the memory structure comprising a charge-blocking region radially inward of individual of the gate regions, a charge-storage region radially inward of individual of the charge-blocking regions, and insulative charge-passage material radially inward of individual of the charge-storage regions, the charge-blocking regions comprising a charge-blocking material; and
- an annular recess in the tier comprising the insulator material, the annular recess projecting radially-outward to be directly under conducting material that is in the individual wordline tiers, the charge-blocking material being in the annular recess that is in the tier comprising the insulator material and being directly under the conductive material that is in the individual wordline tiers.

23. A memory array comprising:
- a vertical stack comprising:
  - a tier comprising conductor material;
  - a tier comprising insulator material above the tier comprising conductor material;
  - a tier comprising conductive material above the tier comprising insulator material;
  - alternating insulative tiers and wordline tiers above the tier comprising the conductive material, the wordline tiers comprising gate regions of individual memory cells, the gate regions individually comprising part of a wordline in individual of the wordline tiers;
- channel material extending elevationally through the insulative tiers, the wordline tiers, the tier comprising the conductive material, and the tier comprising the insulator material; the channel material being directly electrically coupled to the conductor material of the tier comprising the conductor material;
- the individual memory cells comprising a memory structure between the gate region and the channel material; the memory structure comprising a charge-blocking region radially inward of individual of the gate regions, a charge-storage region radially inward of individual of the charge-blocking regions, and insulative charge-passage material radially inward of individual of the charge-storage regions, the charge-blocking regions comprising a charge-blocking material; and
- an annular recess in the tier comprising the insulator material and in the tier comprising the conductive material, the annular recess projecting radially-outward to be directly under conducting material that is in the individual wordline tiers, the charge-blocking material being in the annular recess that is in the tier comprising the insulator material and in the tier comprising the conductive material and being directly under the conducting material that is in the individual wordline tiers.

24. The method of claim 19 wherein the etching through the insulative tiers and the wordline tiers to the insulative etch-stop material of the non-sacrificial lines occurs after the forming of the channel material.

25. The method of claim 20 wherein the etching through the insulative tiers and the wordline tiers to the conductive etch-stop material of the non-sacrificial landing pads occurs after the forming of the channel material.

26. The memory array of claim 22 wherein the conductor material comprises conductively-doped semiconductor material above metal material.

27. The memory array of claim 22 wherein the charge-storage region comprises charge-storage material, the charge-storage material being in the annular recess that is in the tier comprising the insulator material and being directly under the conductive material that is in the individual wordline tiers.

28. The memory array of claim 27 wherein the insulative charge-passage material is in the annular recess that is in the tier comprising the insulator material and is directly under the conductive material that is in the individual wordline tiers.

29. The memory array of claim 22 wherein the annular recess extends to above the tier comprising the insulator material, the charge-blocking material being in the annular recess above the tier comprising the insulator material.

30. The memory array of claim 29 comprising a tier comprising conducting material between: a) the alternating insulative tiers and wordline tiers, and b) the tier comprising conductor material, the annular recess extending into the tier comprising the conducting material, the charge-blocking material that is in the annular recess being directly against the conducting material of the tier comprising the conducting material.

31. The memory array of claim 22 comprising a tier comprising conducting material between: a) the alternating insulative tiers and wordline tiers, and b) the tier comprising conductor material, the annular recess being everywhere below the tier comprising the conducting material.

32. The memory array of claim 31 wherein the annular recess is everywhere spaced below a bottom-most surface of the conducting material of the tier comprising the conducting material, the charge-blocking material that is in the annular recess thereby not being directly against the bottom-most surface of the conducting material of the tier comprising the conducting material.

33. The memory array of claim 22 wherein none of the channel material is in the annular recess.

34. The memory array of claim 23 wherein the tier comprising the conductive material comprises a select gate source control line.

35. The memory array of claim 23 wherein the tier comprising the conductive material does not comprise a select gate source control line.

36. The memory array of claim 23 comprising multiple of said tiers comprising the conductive material above the tier comprising the insulator material and which are below the alternating insulative tiers and wordline tiers, the annular recess being in said multiple of said tiers comprising the conductive material.

37. The memory array of claim 36 wherein at least one of said multiple of said tiers comprises the conductive material comprises a select gate source control line.

38. The memory array of claim 36 wherein at least one of said multiple of said tiers comprising the conductive material does not comprise a select gate source control line.

39. The memory array of claim 36 wherein, at least one of said multiple of said tiers comprising the conductive material comprises a select gate source control line; and another at least one of said multiple of said tiers comprising the conductive material does not comprise a select gate source control line.

* * * * *